(12) United States Patent
Wang et al.

(10) Patent No.: US 11,316,538 B2
(45) Date of Patent: Apr. 26, 2022

(54) POLAR CODE ENCODING METHOD AND APPARATUS

(71) Applicant: Huawei Technologies Co., Ltd., Shenzhen (CN)

(72) Inventors: Jian Wang, Hangzhou (CN); Huazi Zhang, Hangzhou (CN); Rong Li, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/188,588

(22) Filed: Mar. 1, 2021

(65) Prior Publication Data

US 2021/0184696 A1 Jun. 17, 2021

Related U.S. Application Data

(63) Continuation of application No. 16/689,816, filed on Nov. 20, 2019, now Pat. No. 10,965,322, which is a (Continued)

(30) Foreign Application Priority Data

Jul. 21, 2017 (CN) .......................... 201710602910.0

(51) Int. Cl.
*H03M 13/13* (2006.01)
*H03M 13/11* (2006.01)
(Continued)

(52) U.S. Cl.
CPC ....... *H03M 13/13* (2013.01); *H03M 13/1185* (2013.01); *H03M 13/6356* (2013.01);
(Continued)

(58) Field of Classification Search
CPC ............... H03M 13/13; H03M 13/353; H03M 13/6362; H03M 13/6356; H03M 13/6375; H04L 1/0041; H04L 1/0058; H04L 1/0067
See application file for complete search history.

(56) References Cited

U.S. PATENT DOCUMENTS 10,243,592 B2 3/2019 Li et al.
10,523,368 B2 12/2019 Chen et al.
(Continued)

FOREIGN PATENT DOCUMENTS

CN 101860370 A 10/2010
CN 103684477 A 3/2014
(Continued)

OTHER PUBLICATIONS

Huawei et al., "Sequence design for Polar codes", 3GPP TSG RAN WG1 Meeting #89, R1-1706966, May 15-19, 2017, 8 pages.
(Continued)

*Primary Examiner* — Shelly A Chase
(74) *Attorney, Agent, or Firm* — Slater Matsil, LLP

(57) ABSTRACT

A polar code encoding method and apparatus, the method including determining a sorted sequence to encode to-be-encoded bits, where the sorted sequence represents reliability sorting of N polar channels, where N is a mother code length of a polar code, where N is a positive integer, where N is a power of two, and where a minimum sequence number of polar channels in the sorted sequence is 1, obtaining encoded bits by the apparatus by performing polar code encoding on the to-be-encoded bits using the sorted sequence, and outputting, by the apparatus, the encoded bits.

20 Claims, 5 Drawing Sheets

Determine a sorted sequence used to encode to-be-encoded bits — 201

Perform polar code encoding on the to-be-encoded bits by using the sorted sequence, to obtain encoded bits — 202

Related U.S. Application Data continuation of application No. PCT/CN2018/096008, filed on Jul. 17, 2018.

(51) Int. Cl.
  *H03M 13/00* (2006.01)
  *H04L 1/00* (2006.01)
  *H04L 1/16* (2006.01)

(52) U.S. Cl.
  CPC ...... *H03M 13/6375* (2013.01); *H04L 1/0013* (2013.01); *H04L 1/0041* (2013.01); *H04L 1/0058* (2013.01); *H04L 1/1628* (2013.01)

(56) References Cited

U.S. PATENT DOCUMENTS

| | | |
|---|---|---|
| 2014/0169388 A1 | 6/2014 | Jeong et al. |
| 2014/0169492 A1 | 6/2014 | Mahdavifar et al. |
| 2015/0194987 A1 | 7/2015 | Li et al. |
| 2016/0204811 A1* | 7/2016 | Goela .................. H04B 7/0413 375/260 |
| 2016/0352464 A1* | 12/2016 | Shen .................. H03M 13/13 |
| 2017/0047947 A1* | 2/2017 | Hong .................. H04L 1/0067 |
| 2017/0324514 A1 | 11/2017 | Shen et al. |
| 2018/0026663 A1 | 1/2018 | Wu et al. |
| 2019/0268022 A1 | 8/2019 | Xu et al. |

FOREIGN PATENT DOCUMENTS

| | | |
|---|---|---|
| CN | 106506079 A | 3/2017 |
| CN | 106685434 A | 5/2017 |
| CN | 106803759 A | 6/2017 |
| CN | 106899311 A | 6/2017 |
| CN | 106899379 A | 6/2017 |
| WO | 2016112285 A2 | 7/2016 |
| WO | 2016119105 A1 | 8/2016 |
| WO | 2017097098 A1 | 6/2017 |

OTHER PUBLICATIONS

Huawei et al., "Analysis of the sequence of polar codes", 3GPP TSG RAN WGI Meeting#89, R1-1708157, May 15-19, 2017, 10 pages.

Mahdavifar, H. et al.,"Polar Coding for Bit-Interleaved Coded Modulation", IEEE Transactions on Vehicular Technology, vol. 65, No. May 5, 2016, 13 pages.

MCC Support "Final Report of 3GPP TSG RAN WG1 #87 v1.0.0", 3GPP TSG RAN WG1 Meeting #88, R1-1701552, Athens, Greece, Feb. 13-17, 2017, 157 pages.

MCC Support "Final Report of 3GPP TSG RAN WG1 #AH_NR2 v1.0.0",3GPP TSG RAN WG1 Meeting #90, R1-1712032, Prague, Czech Rep, Aug. 21-25, 2017, 109 pages.

QUALCOMM INC., "Sequence construction of Polar codes for control channel", 3GPP TSG-RAN WG1 NR Ad-Hoc #2, R1-1711218, Jun. 27-30, 2017, 18 pages.

* cited by examiner

US 11,316,538 B2

POLAR CODE ENCODING METHOD AND APPARATUS

CROSS-REFERENCE TO RELATED APPLICATIONS

This application is a continuation of U.S. patent application Ser. No. 16/689,816, filed on Nov. 20, 2019, which is a continuation of International Application No. PCT/CN2018/096008, filed on Jul. 17, 2018. The International Application claims priority to Chinese Patent Application No. 201710602910.0, filed on Jul. 21, 2017. All of the aforementioned patent applications are hereby incorporated by reference in their entireties.

TECHNICAL FIELD

Embodiments of this application relate to the field of communications technologies, and in particular, to a polar code encoding method and apparatus.

BACKGROUND

Channel coding, as a most fundamental wireless access technology, plays a vital role in ensuring reliable data transmission. In an existing wireless communications system, a turbo code, a low-density parity-check (LDPC) code, and a polar code are usually used to perform channel coding. The turbo code cannot support information transmission at an excessively low or high code rate. Due to encoding/decoding characteristics of the turbo code and the LDPC code, for medium and short packet transmission, it is difficult for the turbo code and the LDPC code to achieve ideal performance in case of a limited code length. In terms of implementation, the turbo code and the LDPC code have relatively high computation complexity in an encoding/decoding implementation process. The polar code is a high-performance code that has been theoretically proved to be capable of achieving a Shannon capacity and that has relatively low encoding/decoding complexity, and therefore is applied increasingly widely.

However, as the wireless communications system evolves rapidly, a future communications system such as a fifth generation (5G) communications system has some new characteristics. For example, three most typical communications scenarios include enhanced mobile broadband (eMBB), massive machine type communications (mMTC), and ultra-reliable and low latency communications (URLLC). A higher requirement is imposed for encoding/decoding performance of a polar code in these communications scenarios.

Reliability sorting of polar channels play a vital role in encoding/decoding performance of a polar code. However, in the current phase, accuracy of the reliability sorting of the polar channels is not ideal, affecting further improvement of the encoding/decoding performance of the polar code in an application process.

SUMMARY

Embodiments of this application provide a polar code encoding method and apparatus, to improve accuracy of reliability sorting of polar channels.

According to a first aspect, a polar code encoding method is provided. A bitwise construction method for each mother code length is used, to obtain a sorted sequence for polar code construction. This can better reflect actual channel reliability, helping improve accuracy of reliability sorting of polar channels and improve encoding/decoding performance of a polar code.

In a possible design, A sorted sequence used to encode to-be-encoded bits is determined, where the sorted sequence is used to represent reliability sorting of N polar channels, N is a mother code length of a polar code, and N is a positive integer power of 2, and polar code encoding is performed on the to-be-encoded bits by using the sorted sequence, to obtain encoded bits.

In a possible design, a length of the to-be-encoded bits is K, the K to-be-encoded bits are mapped to K of the N polar channels, and reliability of the K polar channels is higher than reliability of remaining N-K polar channels.

In a possible design, if arrangement is performed in the sorted sequence in ascending order of reliability of polar channels, the sorted sequence used to encode the to-be-encoded bits in this application is determined by using the following method, including first, obtaining a first sequence, a second sequence, a third sequence, a fourth sequence, and a fifth sequence, then, obtaining a first subsequence that is in the second sequence and in which a sequence number is less than or equal to 64, updating sorting that is of first $(64-t_1+1)$ sequence numbers in the first subsequence and that is in the first subsequence based on sorting that is of the first $(64-t_1+1)$ sequence numbers in the first subsequence and that is in the first sequence, and obtaining a to-be-compared second sequence based on an updated first subsequence, selecting, based on a first target length $k_1$ separately from the second sequence and the to-be-compared second sequence, sequence numbers corresponding to $k_1$ most reliable locations, and obtaining encoded-codeword performance results separately based on the selected sequence numbers and a generated second intermediate result sequence, where the second intermediate result sequence includes $(k_1-1)$ selected sequence numbers, the target length $k_1$ sequentially ranges from $t_1$ to $k_{max}^{(M)}$, and $k_{max}^{(M)}$ is a maximum information bit length when the mother code length is M, selecting, according to a performance determining rule, a sequence number for which optimum performance is obtained, and updating the second intermediate result sequence based on the selected sequence number for which the optimum performance is obtained, and using an updated second intermediate result sequence obtained when $k_1$ is set to $k_{max}^{(M)}$ as the updated first subsequence, and placing the updated first subsequence in the second sequence, to obtain an updated second sequence, next, obtaining a second subsequence that is in the third sequence and in which a sequence number is less than or equal to 128, updating sorting that is of first $(128-t_2+1)$ sequence numbers in the second subsequence and that is in the second subsequence based on sorting that is of the first $(128-t_2+1)$ sequence numbers in the second subsequence and that is in the updated second sequence, and obtaining a to-be-compared third sequence based on an updated second subsequence, selecting, based on a second target length $k_2$ separately from the third sequence and the to-be-compared third sequence, sequence numbers corresponding to $k_2$ most reliable locations, and obtaining encoded-codeword performance results separately based on the selected sequence numbers and a generated third intermediate result sequence, where the third intermediate result sequence includes $(k_2-1)$ selected sequence numbers, the second target length $k_2$ sequentially ranges from $t_2$ to $k_{max}^{(M)}$, and $k_{max}^{(M)}$ is the maximum information bit length when the mother code length is M, selecting, according to the performance determining rule, a sequence number for which optimum performance is obtained, and updating the third intermediate result sequence based on the selected sequence number for which the optimum performance is obtained, and using an updated third intermediate result sequence obtained when $k_2$ is set to $k_{max}^{(M)}$ as the updated second subsequence, and placing the updated second subsequence in the third sequence, to obtain an updated third sequence, next, obtaining a third subsequence that is in the fourth sequence and in which a sequence number is less than or equal to 256, updating sorting that is of first $(256-t_3+1)$ sequence numbers in the third subsequence and that is in the third subsequence based on sorting that is of the first $(256-t_3+1)$ sequence numbers in the third subsequence and that is in the updated third sequence, and obtaining a to-be-compared fourth sequence based on an updated third subsequence, selecting, based on a third target length $k_3$ separately from the fourth sequence and the to-be-compared fourth sequence, sequence numbers corresponding to $k_3$ most reliable locations, and obtaining encoded-codeword performance results separately based on the selected sequence numbers and a generated fourth intermediate result sequence, where the fourth intermediate result sequence includes $(k_3-1)$ selected sequence numbers, the third target length $k_3$ sequentially ranges from $t_3$ to $k_{max}^{(M)}$, and $k_{max}^{(M)}$ is the maximum information bit length when the mother code length is M, selecting, according to the performance determining rule, a sequence number for which optimum performance is obtained, and updating the fourth intermediate result sequence based on the selected sequence number for which the optimum performance is obtained, and using an updated fourth intermediate result sequence obtained when $k_3$ is set to $k_{max}^{(M)}$ as the updated third subsequence, and placing the updated third subsequence in the fourth sequence, to obtain an updated fourth sequence, and finally, obtaining a fourth subsequence that is in the fifth sequence and in which a sequence number is less than or equal to 512, updating sorting that is of first $(512-t_4+1)$ sequence numbers in the fourth subsequence and that is in the fourth subsequence based on sorting and that is of the first $(512-t_4+1)$ sequence numbers in the fourth subsequence and that is in the updated fourth sequence, and obtaining a to-be-compared fifth sequence based on an updated fourth subsequence, selecting, based on a fourth target length $k_4$ separately from the fifth sequence and the to-be-compared fifth sequence, sequence numbers corresponding to $k_4$ most reliable locations, and obtaining encoded-codeword performance results separately based on the selected sequence numbers and a generated fifth intermediate result sequence, where the fifth intermediate result sequence includes $(k_4-1)$ selected sequence numbers, the fourth target length $k_4$ sequentially ranges from $k_4$ to $k_{max}^{(M)}$, and $k_{max}^{(M)}$ is the maximum information bit length when the mother code length is M, selecting, according to the performance determining rule, a sequence number for which optimum performance is obtained, and updating the fifth intermediate result sequence based on the selected sequence number for which the optimum performance is obtained, and using an updated fifth intermediate result sequence obtained when $k_4$ is set to $k_{max}^{(M)}$ as the updated fourth subsequence, and placing the updated fourth subsequence in the fifth sequence, to obtain an updated fifth sequence, where $t_1$, $t_2$, $t_3$, and $t_4$ are all positive integers, and include a minimum information bit quantity plus a CRC bit quantity and a PC bit quantity.

In a possible design, $t_1$, $t_2$, $t_3$, and $t_4$ are determined according to the performance determining rule.

In a possible design, the first sequence, the second sequence, the third sequence, the fourth sequence, and the fifth sequence may be obtained by using the following method, including sequentially selecting one sequence number from $(M-k_5+1)$ sequence numbers based on a fifth target length $k_5$, and each time one sequence number is selected, obtaining an encoded-codeword performance result based on the selected sequence number and a generated intermediate result sequence, where the intermediate result sequence includes $(k_5-1)$ selected sequence numbers, the $(M-k_5+1)$ sequence numbers are non-overlapping with the intermediate result sequence, the target length $k_5$ sequentially ranges from 1 to $k_{max}^{(M)}$, and $k_{max}^{(M)}$ is the maximum information bit length when the mother code length is M, and selecting, according to the performance determining rule, a sequence number for which optimum performance is obtained, and updating the intermediate result sequence based on the selected sequence number for which the optimum performance is obtained, where M is an integer power of 2, when M=64, an updated intermediate result sequence obtained when $k_5$ is set to $k_{max}^{(M)}$ is used as the first sequence, when M=128, an updated intermediate result sequence obtained when $k_5$ is set to $k_{max}^{(M)}$ is used as the second sequence, when M=256, an updated intermediate result sequence obtained when $k_5$ is set to $k_{max}^{(M)}$ is used as the third sequence, when M=512, an updated intermediate result sequence obtained when $k_5$ is set to $k_{max}^{(M)}$ is used as the fourth sequence, and when M=1024, an updated intermediate result sequence obtained when $k_5$ is set to $k_{max}^{(M)}$ is used as the fifth sequence.

In a possible design, when N=1024, the sorted sequence may be a part or all of any one of a sequence (1) to a sequence (16) in this specification.

Using the sorted sequence to perform polar construction can help improve evaluation accuracy of reliability of a polar channel, thereby improving encoding/decoding performance of a polar code.

A smallest value of sequence numbers in any one of the sequence (1) to the sequence (16) in this specification is 1, and the sequence numbers are arranged in ascending order of the reliability of the N polar channels. In a possible design, if arrangement is performed in the sorted sequence in ascending order of the reliability of the N polar channels, and a smallest value of the sequence numbers in the sorted sequence is 0, 1 is subtracted from each sequence number in any sequence to obtain a new sequence, where sequence performance is not affected.

Similarly, in a possible design, if arrangement is performed in the sorted sequence in descending order of the reliability of the N polar channels, sequence numbers in any sequence may be arranged in reverse order to obtain a new sequence, where sequence performance is not affected either.

In a possible design, the sorted sequence may alternatively be represented by using normalized reliability sequences or equivalent reliability sequences of various channels. For example, a sorting location of a channel x in the foregoing sequence is n (where a smallest sequence number in the sorted sequence is denoted as 1). In this case, reliability of the channel may be represented as n or normalized n/N.

In a possible design, locations of fewer elements in the sorted sequence may be exchanged. For example, a sequence number location may be adjusted by a specified magnitude, for example, the specified magnitude is 5. A location of an element whose sequence number is 10 may be adjusted by left and right five locations.

According to a second aspect, a polar code encoding apparatus is provided. The apparatus has functions of implementing the method according to the first aspect and any possible design of the first aspect. The functions may be implemented by hardware, or may be implemented by hardware executing corresponding software. The hardware or software includes one or more modules corresponding to the foregoing functions.

In a possible design, when some or all of the functions are implemented by using hardware, the polar code encoding apparatus includes an input interface circuit, configured to obtain to-be-encoded bits, a logical circuit, configured to perform behavior according to the first aspect and any possible design of the first aspect, and an output interface circuit, configured to output an encoded bit sequence.

Optionally, the polar code encoding apparatus may be a chip or an integrated circuit.

In a possible design, when some or all of the functions are implemented by using software, the polar code encoding apparatus includes a memory, configured to store a program, and a processor, configured to execute the program stored in the memory, where when the program is executed, the polar code encoding apparatus may implement the method according to the first aspect and any possible design of the first aspect.

Optionally, the memory may be a physically independent unit, or may be integrated with the processor.

In a possible design, when some or all of the functions are implemented by using software, the polar code encoding apparatus includes a processor. A memory configured to store a program is located outside of the encoding apparatus, and the processor is connected to the memory by using a circuit/cable, and is configured to read and execute the program stored in the memory.

According to a third aspect, a communications system is provided. The communications system includes a transmit end and a receive end. The transmit end may perform the method according to the first aspect and any possible design of the first aspect.

According to a fourth aspect, a computer storage medium is provided, where the computer storage medium stores a computer program. The computer program includes an instruction used to perform the method according to the first aspect and any possible design of the first aspect.

According to a fifth aspect, an embodiment of this application provides a computer program product including an instruction. When the computer program product is run on a computer, the computer is enabled to perform the method according to the foregoing aspects.

DETAILED DESCRIPTION OF ILLUSTRATIVE EMBODIMENTS

Figure 1:
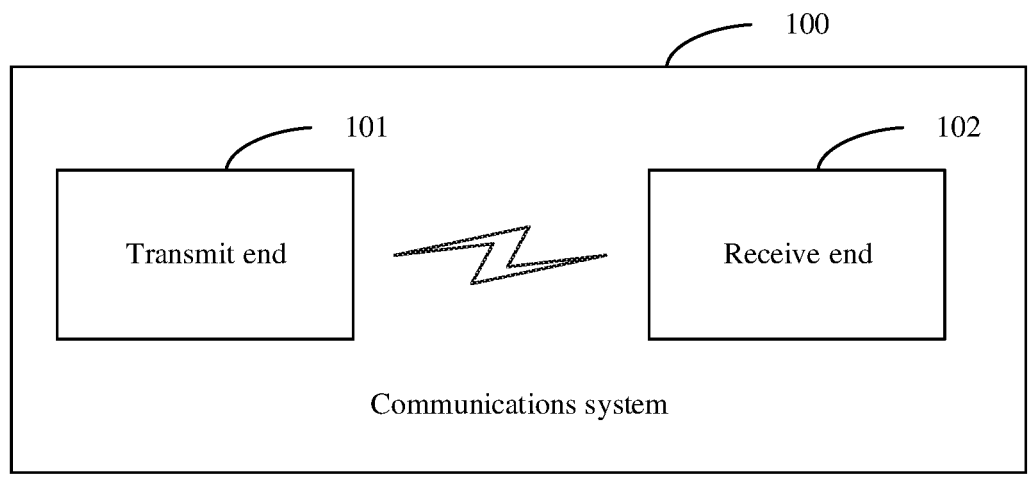
FIG. 1 is a schematic architectural diagram of a communications system to which an embodiment of this application is applied.

The following describes in detail the embodiments of this application with reference to accompanying drawings.

Embodiments of this application provide a polar code encoding method and apparatus. According to a principle of a polar code, a polarization operation affects reliability of each polar channel, so that some polar channels have high reliability and some have low reliability. Selecting a polar channel having higher reliability to transmit information bits can achieve good transmission performance. The embodiments of this application are based on the basic principle of the polar code. A bitwise construction method for each mother code length is used, to obtain a sorted sequence for polar code construction. This can better reflect actual channel reliability, helping improve accuracy of reliability sorting of polar channels and improve encoding/decoding performance of a polar code.

For convenience of understanding the embodiments of this application, a polar code is briefly described below.

According to an encoding policy of the polar code, a noiseless channel is used to transmit information useful to a user, while a pure noisy channel is used to transmit agreed information or is not used to transmit information. The polar code is also a linear block code. An encoding matrix of the polar code is $G_N$. An encoding process is $x_1^N = u_1^N G_N \cdot u_1^N =$ $(u_1, u_2, \ldots, u_N)$ is a binary row vector, and has a length of N (namely, a code length). $G_N$ is an N×N matrix, and $G_N = F_2^{\otimes(\log_2(N))}$. $F_2^{\otimes(\log_2(N))}$ is defined as a Kronecker product of $\log_2 N$ matrices $F_2$. The foregoing matrix $$F_2 = \begin{bmatrix} 1 & 0 \\ 1 & 1 \end{bmatrix}.$$

In the encoding process of the polar code, some bits in $u_1^N$ are used to carry information and are referred to as an information bit set, and a set of indexes of these bits is denoted as A. The other bits are set to fixed values that are agreed on by a receive end and a transmit end in advance and are referred to as a fixed bit set or a frozen bit set (frozen bits), and a set of indexes of these bits is denoted as $A^c$ that is a complementary set of A. The encoding process of the polar code is equivalent to: $x_1^N = u_A G_N(A) \otimes u_{A^c} G_N(A^C)$. Herein, $G_N(A)$ is a submatrix obtained based on rows corresponding to the indexes in the set A in $G_N$, and $G_N(AC)$ is a submatrix obtained based on rows corresponding to the indexes in the set $A^C$ in $G_N$. $u_A$ is an information bit set in $u_1^N$, and a quantity of information bits is K. $u_{A^c}$ is a fixed bit set in $u_1^N$, a quantity of fixed bits is (N-K), and the fixed bits are known bits. These fixed bits are usually set to 0. However, the fixed bits may be set to any value provided that the value is agreed on by the receive end and the transmit end in advance. In this way, encoded output of the polar code may be simplified as $x_1^N = u_A G_N(A)$. Herein, $u_A$ is the information bit set in $u_1^N$, and $u_A$ is a row vector having a length of K. In other words, $|A|=K$, where |·| represents a quantity of elements in a set, K is a size of an information block, $G_N(A)$ is the submatrix obtained based on the rows corresponding to the indexes in the set A in the matrix $G_N$, and $G_N(A)$ is a K×N matrix.

A construction process of the polar code is a process of selecting the set A. This determines performance of the polar code. The construction process of the polar code usually includes determining, based on a code length N of a mother code, that there are N polar channels in total that respectively correspond to N rows of the encoding matrix, computing reliability of the polar channels, and using indexes of first K polar channels having higher reliability as elements in the set A, and using indexes corresponding to the remaining (N-K) polar channels as elements in the set $A^C$ of the indexes of the fixed bits. A location of the information bit depends on the set A, and a location of the fixed bit depends on the set $A^c$.

The sorted sequence in the embodiments of this application is used to represent reliability sorting of N polar channels, where N is a mother code length of a polar code, and N is a positive integer power of 2.

Generally, the sorted sequence may include sequence numbers of the N polar channels, and the sequence numbers of the N polar channels are arranged in the sorted sequence based on reliability of the N polar channels, for example, may be arranged in descending order of the reliability or in ascending order of the reliability. For convenience of description, the sorted sequence is referred to as a Q sequence.

In another case, the sorted sequence may include values of reliability of the N polar channels. Optionally, the values of the reliability may be a value of normalized reliability or a value of equivalent reliability. For example, a sorting location of a channel x in the sorted sequence is n (where a smallest sequence number in the sorted sequence is denoted as 1). In this case, reliability of the channel may be represented as n or normalized n/N. Similarly, the values of the reliability of the N polar channels may be arranged in the sorted sequence in descending order of the reliability or in ascending order of the reliability. For convenience of description, the sorted sequence is referred to as a Z sequence. It can be known that the Q sequence and the Z sequence may be mutually converted. That is, if the Q sequence is known, the Z sequence may be obtained, and vice versa.

Values of elements in the sorted sequence may be from 0 to N-1, or may be from 1 to N. In the embodiments of this application, that the values of the elements in the sorted sequence are 1 to N is used as an example for description. It can be learned that 1 may be subtracted from a value of each element in the sorted sequence to obtain a sorted sequence in which values of elements are 0 to N-1. The two sorted sequences have same performance, and both of them can represent reliability sorting of N polar channels. For the sorted sequence designed in the embodiments of this application, arrangement is performed in ascending order of reliability is used as an example for description. It may be understood that all elements in the sorted sequence may be arranged in reverse order to obtain a sorted sequence in which elements are arranged in descending order of the reliability. The two sorted sequences have same performance, and both of them can represent reliability sorting of N polar channels.

As shown in FIG. 1, a communications system 100 to which an embodiment of this application is applied includes a transmit end 101 and a receive end 102. The transmit end 101 may also be referred to as an encoder, and the receive end 102 may also be referred to as a decoder. The transmit end 101 may be a base station, and the receive end 102 is a terminal. Alternatively, the transmit end 101 is a terminal, and the receive end 102 is a base station. The base station is an apparatus deployed in a radio access network and configured to provide a wireless communication function for the terminal. The base station may include macro base stations, micro base stations, relay stations, access points, and the like in various forms, and may be applied to systems of different radio access technologies, for example, to more possible communications systems such as a long term evolution (LTE) system or a fifth generation (5G) communications system. The base station may further be another network device having a base station function, and particularly, may further be a terminal that serves as the base station function in D2D communication. The terminal may include various handheld devices, in-vehicle devices, wearable devices, or computing devices having a wireless communications function, or another processing device connected to a wireless modem, and various forms of user equipments (UE), mobile stations (MS), and the like.

Based on the architecture of the communications system shown in FIG. 1, in the embodiments of this application, the polar code encoding method may be performed by the transmit end 101. The following describes in detail the polar code encoding method provided in the embodiments of this application.

Figure 2:
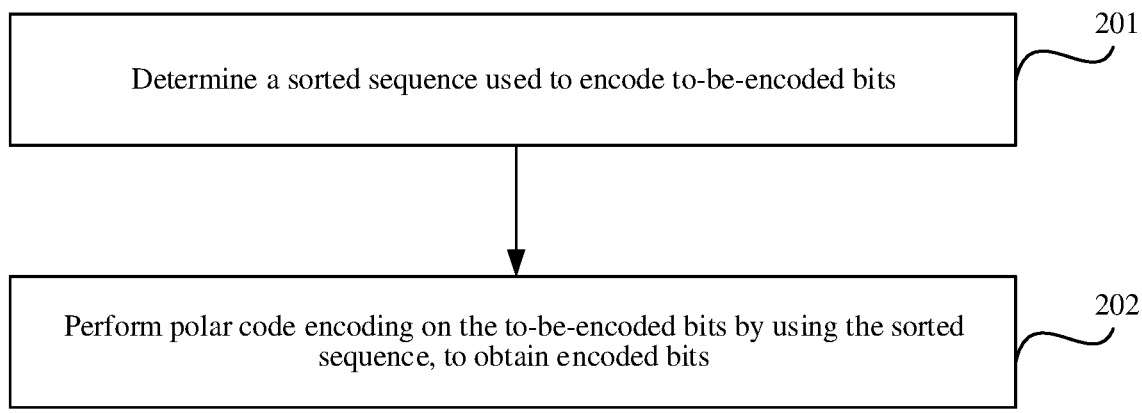
FIG. 2 is a schematic flowchart of a polar code encoding method according to an embodiment of this application.

Based on the architecture of the communications system shown in FIG. 1, as shown in FIG. 2, a specific procedure of a polar code encoding method provided in an embodiment of this application is as follows.

Step 201. Determine a sorted sequence used to encode to-be-encoded bits.

The sorted sequence is used to represent reliability sorting of N polar channels, N is a mother code length of a polar code, and N is a positive integer power of 2.

Step 202. Perform polar code encoding on the to-be-encoded bits by using the sorted sequence, to obtain encoded bits.

A length of the to-be-encoded bits is K, the K to-be-encoded bits are mapped to K of the N polar channels, and reliability of the K polar channels is higher than reliability of remaining N-K polar channels.

In an actual application, the sorted sequence may be stored offline. After a transmission parameter (for example, a code length and a code rate) is given, the prestored sorted sequence is used to determine a polar construction method, to be specific, determine an information bit set and a frozen bit set that are used for polar code construction. For example, a polar code construction method may be obtained through table reading.

The following specifically describes how the sorted sequence applied to the embodiments of this application is obtained.

First, in a process of obtaining the sorted sequence in this application, a sequence performance comparison rule may be applied. The embodiments of this application provide an example of the performance determining rule, but are not limited thereto.

The sorted sequence needs to satisfy a simple nesting characteristic. That is, after a sorted sequence having a maximum mother code length is determined, another sorted sequence having a shorter mother code length may be obtained based on the sorted sequence having the maximum mother code length. A possible performance determining rule is as follows.

Evaluation metrics: signal-to-noise ratio (SNR) required for a block error rate (BLER) to reach $10^{-2}$ and $10^{-3}$.

Simulation and Assumption:

| | |
|---|---|
| Channel | Additive white gaussian noise (additive white gaussian noise, AWGN) channel (channel) |
| Modulation mode | Quadrature phase shift keying (quadrature phase shift keying, QPSK) |
| Information code block length K (where K does not include a CRC bit) | $K = [8, \min(200, K_{max\_N})]$, where $K_{max\_N} = \lfloor 5N/6 - (J + J') \rfloor$ $K = (\min(200, K_{max\_N}), K_{max\_N}]$, where $K_{max\_N} = \lfloor 5N/6 - (J + J') \rfloor$ where a K value making a code rate less than 1/8 is not considered. |
| Encoding length N | {64, 128, 256, 512, 1024} |
| Decoding algorithm | LLR min-sum based decoding algorithm for a list-X |
| Size of a list X | 1, 2, 4, 8, 16 (Only eight optimum paths are used for CRC checking) |
| Construction method | CA polar |
| (J + J') quantity | 19 bits (0b1010001010101111001, where the last bit is d19) |

SNR values required for a BLER to reach $10^{-2}$ and $10^{-3}$ are evaluated. That is, sequences A and B are given, and each combination (N, K) is examined based on the simulation parameters in the foregoing table. For example, for N=64 and K=10, an SNR value required for a polar code, using the sequence A, to reach BLER=$10^{-2}$ is denoted as HA, and an SNR value required for a polar, using the sequence B, to reach BLER=$10^{-2}$ is denoted as HB. Their difference HA−HB is compared with a given threshold. When the difference is greater than the threshold, it denotes that the sequence B wins, and when 1 is added to a quantity of times that the sequence B wins, 1 is added to a quantity of times that the sequence A fails. When the difference is less than a negative threshold, it denotes that the sequence A wins, and when 1 is added to a quantity of times that the sequence A wins, 1 is added to a quantity of times that the sequence B fails. When the difference is less than or equal to the threshold and is greater than or equal to the negative threshold, it denotes that the two sequences have same performance, and neither of quantities of times that the sequence A and the sequence B win is increased. Further, SNR values required for the sequences A and B to reach BLER=$10^{-3}$ are examined, their difference is compared with the threshold, and an operation is further performed on a quantity of wins.

Steps for determining the threshold are as follows, including when a length K of to-be-encoded information is less than or equal to 200, it denotes that PerfThresh_K=0.1 dB, and when K is greater than 200, it denotes that PerfThresh_K=0.3 dB, when a quantity L of decoding lists is equal to 1, PerfThresh_L=0.4 dB, when L=2, PerfThresh_L=0.2 dB, and when L is another value, PerfThresh_L=0.1 dB, and a larger one of the foregoing two thresholds is used as a final threshold, that is, PerfThresh=max(PerfThresh_K, PerfThresh_L).

A specific sequence comparison procedure is as follows.

Step 1: Compute a quantity of wins, a quantity of failures, and an overall quantity of failures of each sequence. A sequence A is taken, and is compared with the sequence B in each simulation instance. For each simulation instance, if performance of A is poorer than that of B by PerfThresh, 1 is added to a quantity FailCount_AB of failures of A to B, if the performance of A is better than that of B by PerfThresh, 1 is added to a quantity WinCountAB of wins of A to B, and if (FailCount_AB−WinCountAB)/Total quantity of simulation instances >2%, 1 is added to an overall quantity OverallFail_A of failures of A. The sequence A is compared with a sequence C in each simulation instance. For each simulation instance, if performance of A is poorer than that of C by PerfThresh, 1 is added to a quantity FailCount_AC of failures of A to C, if the performance of A is better than that of C by PerfThresh, 1 is added to a quantity WinCount_AC of wins of A to C, if (FailCount_AC−WinCountAC)/ Total quantity of simulation instances >2%, 1 is added to an overall quantity OverallFail_A of failures of A. For sequences D to N, repeat this process. The sequence B is taken, and is compared with the sequence B in each simulation instance, and the rest can be deduced by analogy. The sequence N is taken, and is compared with the sequence A in each simulation instance, and the rest can be deduced by analogy. A sequence with a smallest overall quantity OverallFail of failures is selected.

Step 2. If a plurality of sequences, namely, A to M, each have a minimum overall quantity OverallFail of failures. A sequence A is compared with a sequence B in each simulation instance. For each simulation instance, if performance of A is better than that of B by PerfThresh, 1 is added to a quantity WinCount_AB of wins of A to B. The sequence A is compared with a sequence C in each simulation instance. For each simulation instance, if performance of A is better than that of C by PerfThresh, 1 is added to a quantity WinCount_AC of wins of A to C, and a total quantity of wins of A is WinCountA=ΣWinCount_AB . . . AM. This process is repeated until M is computed. For sequences of B to M, repeat this process. A sequence whose total quantity WinCount of wins is largest is selected. It is assumed that the sequence is the sequence W.

Step 3: The sequence W having a largest quantity of wins is given. If a sequence x exists, where a quantity of wins of x to W is greater than a quantity of wins of W to x, that is, WinCount_xW>WinCountWx, the sequence x is also selected for a next round.

Step 4: If a plurality of sequences are selected, a final sequence is determined through voting.

That the sorted sequence is a Q sequence is used as an example. A method for obtaining the sorted sequence applied in this embodiment of this application roughly includes two steps.

First, sequences having optimum performance are sequentially obtained according to the performance determining rule when the mother code length is 64, 128, 256, 512, and 1024.

For convenience of description, the sequence obtained when the mother code length is 64 is denoted as a first sequence or $Q_{64}$, the sequence obtained when the mother code length is 128 is denoted as a second sequence or $Q_{128}$, the sequence obtained when the mother code length is 256 is denoted as a third sequence or $Q_{256}$, the sequence obtained when the mother code length is 512 is denoted as a fourth sequence or $Q_{512}$, and the sequence obtained when the mother code length is 1024 is denoted as a fifth sequence or $Q_{1024}$.

Second, the five sequences are combined to obtain an updated sequence having a length of 1024, and the updated sequence is used as the sorted sequence applied in this embodiment of this application.

First, a first subsequence in which a sequence number is less than or equal to 64 in the second sequence is obtained, that is, a set of elements whose values are less than or equal to 64 in $Q_{128}$. A set of first $(64-t_1+1)$ sequence numbers sorted top in the first subsequence is determined, and is denoted as $P_{64-t1+1}$. Sorting that is of the first $(64-t_1+1)$ sequence numbers in the first subsequence and that is in the first subsequence is updated based on sorting that is of the first $(64-t_1+1)$ sequence numbers in the first subsequence and that is in the first sequence, and a to-be-compared second sequence is obtained based on an updated first subsequence. That is, sorting of values of elements in $P_{64-t1+1}$ is found in $Q_{64}$, and the sorting is used to sequentially replace sorting that is of the first $(64-t_1+1)$ sequence numbers in the first subsequence and that is in the first subsequence, to obtain $Q_{128}^*$, where $Q_{128}^*$ may be referred to as the to-be-compared second sequence. L is a positive integer, and includes but is not limited to a minimum information bit quantity plus a cyclic redundancy check (CRC) bit quantity and a parity check (PC) bit quantity. For example, L is the information bit quantity plus a CRC length according to the performance determining rule, and $t_1=8+19=27$, where 8 indicates the information bit quantity, and 19 indicates the CRC length. Sequence numbers corresponding to $k_1$ most reliable locations are selected based on a first target length $k_1$ separately from the second sequence and the to-be-compared second sequence, and encoded-codeword performance results are separately obtained based on the selected sequence numbers and a generated second intermediate result sequence, where the second intermediate result sequence includes $(k_1-1)$ selected sequence numbers, the target length $k_1$ sequentially ranges from $t_1$ to $k_{max}^{(M)}$, and $k_{max}^{(M)}$ is a maximum information bit length when the mother code length is M=64. A sequence number for which optimum performance is obtained is selected according to a performance determining rule, and the second intermediate result sequence is updated based on the selected sequence number for which the optimum performance is obtained. An updated second intermediate result sequence obtained when $k_1$ is set to $k_{max}^{(M)}$ is used as the updated first subsequence, and the updated first subsequence is placed in the second sequence, to obtain an updated second sequence. The updated second sequence may also be denoted as $Q_{128}^{opt}$. That is, from $k_1=27$ to $k_1=64$, each time a value of $k_1$ is taken, performance of polar codes separately constructed based on $Q_{128}$ and $Q_{128}^*$, that is, performance of polar codes of $(M=128, K_1)$, is compared, where M is the code length, $K_1$ is a length of an information bit sequence number set. It may be understood that, in this case, performance of a polar code of $(M=128, K_1)$ is examined by consideration of performance of a polar code of $(M=64, K_1)$. Each time a sequence number having better performance is selected, the sequence number is put into $Q_{128}^{opt}$. When polar codes constructed by using the two sequences $Q_{128}$ and $Q_{128}^*$ have same performance, the sequence number is directly put into $Q_{128}^{opt}$.

Next, similarly, a second subsequence that is in the third sequence and in which a sequence number is less than or equal to 128 is obtained. Sorting that is of first $(128-t_2+1)$ sequence numbers in the second subsequence and that is in the second subsequence is updated based on sorting that is of the first $(128-t_2+1)$ sequence numbers in the second subsequence and that is in the updated second sequence. A to-be-compared third sequence is obtained based on an updated second subsequence. Sequence numbers corresponding to $k_2$ most reliable locations are selected based on a second target length $k_2$ separately from the third sequence and the to-be-compared third sequence. Encoded-codeword performance results are separately obtained based on the selected sequence numbers and a generated third intermediate result sequence, where the third intermediate result sequence includes $(k_2-1)$ selected sequence numbers, the second target length $k_2$ sequentially ranges from $t_2$ to $k_{max}^{(M)}$, and $k_{max}^{(M)}$ is the maximum information bit length when the mother code length is M=128. A sequence number for which optimum performance is obtained is selected according to the performance determining rule, and the third intermediate result sequence is updated based on the selected sequence number for which the optimum performance is obtained. An updated third intermediate result sequence obtained when $k_2$ is set to $k_{max}^{(M)}$ is used as the updated second subsequence, and the updated second subsequence is placed in the third sequence, to obtain an updated third sequence. Popularly speaking, $Q_{128}^{opt}$ and $Q_{256}$ are taken, and a set of first $(128-t_2+1)$ elements whose sequence numbers are less than or equal to 128 in $Q_{256}$ is denoted as $P_{128-t2+1}$. An order of elements included in $P_{128-t2+1}$ is found in $Q_{128}^{opt}$, and based on the order, an order that is of first $(128-t_2+1)$ sequence numbers in the second subsequence and that is in the second subsequence is replaced, to obtain a sequence $Q_{256}^*$ having a length of 256. $t_2$ is a positive integer, and includes a minimum information bit quantity plus a CRC bit quantity and a PC bit quantity. For example, $t_2$ is the information bit quantity plus a CRC length according to the performance determining rule, and $t_2=8+19=27$. From $k_2=t_2$ to $k_2=128$, each time a value of $k_2$ is taken, performance of polar codes separately constructed based on $Q_{256}$ and $Q_{256}^*$, that is, performance of polar codes of $(M=256, K_2)$, is compared, where M is the code length, $K_2$ is a length of an information bit sequence number set. It may be understood that, in this case, performance of a polar code of $(M=256, K_2)$ is examined by consideration of performance of a polar code of $(M=128, K_2)$. Each time a sequence number having better performance is selected, the sequence number is put into $Q_{128}^{opt}$. When polar codes constructed by using the two sequences $Q_{256}$ and $Q_{256}^*$ have same performance, the sequence number is directly put into $Q_{256}^{opt}$.

Next, similarly, a third subsequence that is in the fourth sequence and in which a sequence number is less than or equal to 256 is obtained. Sorting that is of first $(256-t_3+1)$ sequence numbers in the third subsequence and that is in the third subsequence is updated based on sorting that is of the first $(256-t_3+1)$ sequence numbers in the third subsequence and that is in the updated third sequence, and a to-be-compared fourth sequence is obtained based on an updated third subsequence. Sequence numbers corresponding to $k_3$ most reliable locations are selected based on a third target length $k_3$ separately from the fourth sequence and the to-be-compared fourth sequence, and encoded-codeword performance results are separately obtained based on the selected sequence numbers and a generated fourth intermediate result sequence, where the fourth intermediate result sequence includes $(k_3-1)$ selected sequence numbers, the third target length $k_3$ sequentially ranges from $t_3$ to $k_{max}^{(M)}$, and $k_{max}^{(M)}$ is the maximum information bit length when the mother code length is M=256. A sequence number for which optimum performance is obtained is selected according to the performance determining rule, and the fourth intermediate result sequence is updated based on the selected sequence number for which the optimum performance is obtained. An updated fourth intermediate result sequence obtained when $k_3$ is set to $k_{max}^{(M)}$ is used as the updated third subsequence, and the updated third subsequence is placed in the fourth sequence, to obtain an updated fourth sequence. Popularly speaking, $Q_{256}^{opt}$ and $Q_{512}$ are taken, and a set of first $(256-t_3+1)$ elements whose sequence numbers are less than or equal to 256 in $Q_{512}$ is denoted as $P_{256-3+1}$. An order of elements included in $P_{256-t_3+1}$ is found in $Q_{256}^{opt}$, and based on the order, an order that is of first $(256-t_3+1)$ sequence numbers in the third subsequence and that is in the third subsequence is replaced, to obtain a sequence $Q_{512}^*$ having a length of 512. $t_3$ is a positive integer, and includes a minimum information bit quantity plus a CRC bit quantity and a PC bit quantity. For example, $t_3$ is the information bit quantity plus a CRC length according to the performance determining rule, and $t_3=8+19=27$. From $k_3=t_3$ to $k_3=256$, each time a value of $k_3$ is taken, performance of polar codes separately constructed based on $Q_{512}$ and $Q_{512}^*$, that is, performance of polar codes of $(M=512, K_3)$, is compared, where M is the code length, $K_3$ is a length of an information bit sequence number set. It may be understood that, in this case, performance of a polar code of $(M=512, K_3)$ is examined by consideration of performance of a polar code of $(M=256, K_3)$. Each time a sequence number having better performance is selected, the sequence number is put into $Q_{512}^{opt}$. When polar codes constructed by using the two sequences $Q_{512}$ and $Q_{512}^*$ have same performance, the sequence number is directly put into $Q_{512}^{opt}$.

Finally, similarly, a fourth subsequence that is in the fifth sequence and in which a sequence number is less than or equal to 512 is obtained. Sorting that is of first $(512-t_4+1)$ sequence numbers in the fourth subsequence and that is in the fourth subsequence is updated based on sorting that is of the first $(512-t_4+1)$ sequence numbers in the fourth subsequence and that is in the updated fourth sequence, and a to-be-compared fifth sequence is obtained based on an updated fourth subsequence. Sequence numbers corresponding to $k_4$ most reliable locations are selected based on a fourth target length $k_4$ separately from the fifth sequence and the to-be-compared fifth sequence, and encoded-codeword performance results are separately obtained based on the selected sequence numbers and a generated fifth intermediate result sequence, where the fifth intermediate result sequence includes $(k_4-1)$ selected sequence numbers, the fourth target length $k_4$ sequentially ranges from $k_4$ to $k_{max}^{(M)}$, and $k_{max}^{(M)}$ is the maximum information bit length when the mother code length is $M=512$. A sequence number for which optimum performance is obtained is selected according to the performance determining rule, and the fifth intermediate result sequence is updated based on the selected sequence number for which the optimum performance is obtained. An updated fifth intermediate result sequence obtained when $k_4$ is set to $k_{max}^{(M)}$ is used as the updated fourth subsequence, and the updated fourth subsequence is placed in the fifth sequence, to obtain an updated fifth sequence. Popularly speaking, $Q_{512}^{opt}$ and $Q_{1024}$ are taken, and a set of first $(512-t_4+1)$ elements whose sequence numbers are less than or equal to 512 in $Q_{1024}$ is denoted as $P_{512-t4+1}$. An order of elements included in $P_{512-t4+1}$ is found in $Q_{512}^{opt}$, and based on the order, an order that is of first $512-t_4+1)$ sequence numbers in the fourth subsequence and that is in the fourth subsequence is replaced, to obtain a sequence $Q_{1024}^*$ having a length of 1024. $t_4$ is a positive integer, and includes a minimum information bit quantity plus a CRC bit quantity and a PC bit quantity. For example, $t_4$ is the information bit quantity plus a CRC length according to the performance determining rule, and $t_4=8+19=27$. From $k_4=t_4$ to $k_4=512$, each time a value of $k_4$ is taken, performance of polar codes separately constructed based on $Q_{1024}$ and $Q_{1024}^*$, that is, performance of polar codes of $(M=1024, K_4)$, is compared, where M is the code length, $K_4$ is a length of an information bit sequence number set. It may be understood that, in this case, performance of a polar code of $(M=1024, K_4)$ is examined by consideration of performance of a polar code of $(M=1024, K_4)$. Each time a sequence number having better performance is selected, the sequence number is put into $Q_{1024}^{opt}$. When polar codes constructed by using the two sequences $Q_{1024}$ and $Q_{1024}^*$ have same performance, the sequence number is directly put into $Q_{1024}^{opt}$.

The updated fifth sequence is the sorted sequence used to encode the to-be-encoded bits in this embodiment of this application. The sorted sequence corresponds to the maximum mother code length of 1024. Optionally, because the sorted sequence obtained by using the foregoing method satisfy a nesting characteristic, when the sorted sequence having the maximum mother code length is determined, another sorted sequence having a shorter mother code length may be obtained based on the sorted sequence. For example, sorted sequences having mother code lengths of 64, 128, 256, and 512 are obtained.

The following specifically describes how to obtain the first sequence to the fifth sequence in the foregoing steps.

Specifically, one sequence number is sequentially selected from $(M-k_5+1)$ sequence numbers based on a fifth target length $k_5$, and each time one sequence number is selected, an encoded-codeword performance result is obtained based on the selected sequence number and a generated intermediate result sequence. The intermediate result sequence includes $(k_5-1)$ selected sequence numbers, the $(M-k_5+1)$ sequence numbers are non-overlapping with the intermediate result sequence, the target length $k_5$ sequentially ranges from 1 to $k_{max}^{(M)}$, where $k_{max}^{(M)}$ is the maximum information bit length when the mother code length is M, and $k_{max}$ is a length of a maximum information bit vector supported by a system, for example, $k_{max}$ is a value described in the performance determining rule, that is, $5N/6-(J+J')$. Herein, N may be actually considered as M, that is, different code lengths correspond to different values of $k_{max}$. A sequence number for which optimum performance is obtained is selected according to the performance determining rule, and the intermediate result sequence is updated based on the selected sequence number for which the optimum performance is obtained. M is an integer power of 2, M is the mother code length, and the mother code length is 64, 128, 256, 512, or 1024.

For example, when $M=64$, an initial value of the intermediate result sequence $Q_N$ is set to an empty set, an initial value of $k_5$ is set to 0, and $k_5=k_5+1$ is performed to select a sequence number $i_{k_5}$ of a polar channel, where $i_{k_5} \in [1, N]$ and $i_{k_5} \notin Q_N$. To be specific, a polar channel is selected from undetermined polar channels, and selected $i_{k_5}$ is placed at the first bit in the sequence $Q_N$, so that updated $Q_N$ is an optimum sequence obtained according to the performance determining rule for performance of a polar code of $(M=64, K=k_5)$. Whether $k_5$ is greater than or equal to $k_{max}$ is determined. If $k_5$ is not greater than or equal to $k_{max}$, return to perform $k_5=k_5+1$. If $k_5$ is greater than or equal to $k_{max}$, the operation is ended.

For another example, when $M=128$, an initial value of the intermediate result sequence $Q_N$ is set to an empty set, an initial value of $k_5$ is set to 0, and $k_5=k_5+1$ is performed to select a sequence number $i_{k_5}$ of a polar channel, where $i_{k_5} \in [1, N]$ and $i_{k_5} \notin Q_N$. To be specific, a polar channel is selected from undetermined polar channels, and selected $i_{k_5}$ is placed at the first bit in the sequence $Q_N$, so that updated $Q_N$ is an optimum sequence obtained according to the performance determining rule for performance of a polar code of (M=128, K=$k_5$). Whether $k_5$ is greater than or equal to $k_{max}$, is determined. If $k_5$ is not greater than or equal to $k_{max}$, return to perform $k_5$=$k_5$+1. If $k_5$ is greater than or equal to $k_{max}$, the operation is ended.

In this way, sequences having mother code lengths of 64, 128, 256, 512, and 1024 separately may be obtained. That is, the first sequence to the fifth sequence may be obtained.

As described above, after the Q sequence is obtained, in this embodiment of this application, a Z sequence may be obtained based on the Q sequence.

This embodiment of this application provides some optional examples of the sorted sequence as follows. Using the following sorted sequences can help improve encoding/decoding performance of a polar code. The following sequences may be obtained by using the method provided in this embodiment of this application, or may be obtained by using another possible method. This is not limited in this embodiment of this application.

When N=1024, the sorted sequence is a Q sequence, and is denoted as a sequence (1):

[1, 2, 3, 5, 9, 17, 33, 4, 6, 65, 7, 10, 11, 129, 18, 13, 19, 34, 257, 21, 35, 25, 66, 37, 67, 513, 8, 12, 130, 41, 69, 14, 20, 131, 49, 15, 73, 258, 22, 133, 36, 81, 23, 259, 26, 137, 38, 261, 97, 145, 27, 514, 39, 515, 265, 68, 42, 29, 161, 70, 43, 517, 50, 71, 273, 193, 521, 529, 45, 16, 132, 74, 51, 289, 545, 24, 75, 53, 134, 82, 321, 77, 135, 28, 57, 83, 138, 260, 40, 98, 385, 30, 85, 139, 262, 146, 31, 99, 516, 44, 89, 141, 263, 147, 101, 266, 72, 46, 162, 518, 577, 519, 52, 149, 522, 47, 76, 267, 163, 274, 523, 641, 105, 54, 153, 78, 269, 194, 165, 275, 55, 84, 530, 525, 531, 136, 58, 113, 195, 290, 79, 169, 277, 59, 86, 61, 87, 140, 100, 197, 90, 291, 281, 546, 769, 142, 177, 91, 102, 148, 143, 533, 547, 537, 32, 103, 264, 48, 322, 293, 201, 323, 578, 150, 297, 93, 106, 209, 549, 579, 268, 386, 325, 305, 164, 151, 107, 56, 154, 225, 387, 329, 270, 114, 520, 553, 642, 80, 166, 109, 155, 276, 60, 271, 115, 167, 524, 581, 561, 157, 196, 170, 198, 171, 278, 292, 279, 117, 88, 62, 178, 282, 526, 643, 532, 527, 63, 92, 585, 770, 144, 389, 294, 199, 104, 337, 173, 283, 202, 121, 179, 295, 94, 534, 645, 535, 593, 548, 771, 152, 324, 393, 298, 203, 108, 285, 181, 210, 538, 95, 205, 299, 353, 649, 609, 326, 185, 211, 401, 306, 301, 110, 156, 327, 116, 111, 773, 550, 657, 539, 551, 168, 213, 307, 330, 158, 226, 118, 172, 331, 227, 388, 309, 217, 417, 338, 159, 777, 272, 580, 119, 541, 554, 280, 333, 390, 174, 122, 200, 180, 229, 339, 313, 391, 64, 394, 284, 175, 233, 341, 449, 354, 395, 204, 123, 673, 555, 557, 562, 582, 296, 286, 182, 206, 125, 785, 705, 183, 287, 528, 583, 644, 586, 563, 300, 355, 212, 402, 186, 397, 345, 207, 302, 801, 96, 187, 241, 536, 587, 565, 646, 594, 328, 403, 214, 357, 308, 303, 833, 589, 647, 112, 540, 569, 595, 650, 772, 228, 418, 332, 215, 405, 310, 189, 552, 610, 897, 160, 218, 361, 419, 409, 369, 230, 450, 421, 542, 597, 651, 774, 658, 311, 120, 334, 219, 543, 611, 176, 392, 231, 314, 124, 340, 335, 221, 451, 425, 315, 556, 601, 653, 234, 775, 659, 613, 235, 288, 453, 126, 342, 396, 778, 584, 558, 674, 356, 343, 564, 661, 559, 617, 779, 675, 184, 398, 433, 317, 346, 242, 208, 404, 358, 786, 188, 588, 566, 665, 625, 781, 237, 127, 243, 347, 399, 706, 216, 677, 787, 590, 567, 648, 406, 359, 304, 570, 596, 362, 707, 190, 457, 349, 465, 802, 420, 407, 245, 410, 591, 681, 789, 571, 598, 363, 573, 220, 422, 599, 652, 612, 709, 602, 803, 370, 793, 312, 191, 654, 689, 603, 411, 232, 249, 365, 336, 423, 614, 660, 655, 316, 222, 371, 426, 452, 413, 481, 236, 223, 344, 318, 544, 373, 615, 427, 776, 128, 454, 238, 560, 834, 805, 713, 835, 662, 809, 605, 618, 721, 780, 434, 898, 319, 455, 837, 817, 676, 663, 348, 429, 400, 377, 244, 239, 458, 435, 360, 568, 619, 666, 737, 899, 841, 782, 626, 350, 246, 459, 592, 678, 621, 667, 788, 572, 783, 627, 679, 408, 364, 351, 192, 247, 437, 466, 412, 461, 250, 366, 600, 708, 574, 669, 682, 790, 804, 791, 710, 683, 629, 441, 690, 794, 604, 575, 467, 424, 372, 251, 414, 367, 469, 482, 374, 656, 901, 806, 711, 428, 415, 253, 616, 849, 685, 795, 714, 633, 691, 807, 606, 483, 473, 224, 664, 836, 905, 810, 715, 620, 797, 693, 375, 485, 430, 456, 722, 607, 717, 811, 865, 838, 697, 723, 913, 818, 378, 436, 813, 320, 622, 240, 431, 460, 379, 668, 839, 489, 438, 628, 623, 462, 381, 439, 352, 497, 680, 725, 819, 842, 670, 738, 630, 468, 248, 442, 463, 470, 443, 252, 684, 843, 739, 900, 821, 729, 929, 850, 671, 784, 631, 792, 845, 902, 686, 368, 634, 712, 254, 692, 741, 851, 825, 903, 687, 471, 416, 484, 445, 376, 474, 906, 796, 486, 635, 745, 853, 961, 866, 907, 716, 694, 808, 475, 798, 637, 695, 255, 718, 576, 799, 812, 867, 432, 380, 698, 914, 487, 724, 909, 857, 719, 477, 814, 608, 490, 699, 753, 840, 915, 726, 869, 820, 815, 440, 491, 624, 382, 498, 493, 464, 672, 930, 844, 740, 917, 822, 727, 632, 701, 873, 931, 921, 881, 730, 383, 499, 444, 446, 472, 962, 933, 823, 742, 846, 731, 447, 688, 904, 636, 826, 743, 852, 847, 256, 476, 733, 963, 937, 827, 746, 501, 488, 638, 505, 800, 696, 854, 908, 868, 855, 747, 910, 829, 858, 754, 720, 916, 870, 478, 700, 749, 639, 816, 965, 945, 755, 859, 911, 492, 479, 728, 918, 871, 384, 494, 500, 874, 702, 969, 495, 861, 502, 932, 919, 757, 922, 875, 732, 977, 934, 882, 761, 824, 703, 923, 744, 877, 848, 935, 828, 734, 883, 448, 938, 503, 964, 925, 993, 748, 735, 856, 885, 939, 506, 966, 507, 830, 750, 946, 860, 831, 967, 756, 941, 912, 872, 751, 889, 480, 970, 947, 862, 758, 971, 509, 920, 640, 876, 863, 759, 949, 978, 924, 973, 762, 878, 979, 496, 936, 704, 884, 953, 763, 504, 926, 879, 981, 994, 886, 940, 927, 765, 736, 887, 995, 942, 968, 985, 508, 890, 948, 832, 752, 943, 997, 972, 891, 1001, 510, 950, 974, 893, 951, 864, 760, 1009, 511, 980, 954, 764, 975, 955, 880, 982, 983, 928, 996, 766, 957, 888, 986, 998, 987, 944, 892, 999, 767, 512, 989, 1002, 952, 1003, 894, 976, 895, 1010, 956, 1005, 1011, 958, 984, 959, 988, 1013, 1000, 1017, 768, 990, 1004, 991, 1006, 1012, 1007, 1014, 896, 960, 1015, 1018, 1019, 992, 1021, 1008, 1016, 1020, 1022, 1023, 1024].

When N=1024, the sorted sequence is a Z sequence, and is denoted as a sequence (2):

[1, 2, 3, 8, 4, 9, 11, 27, 5, 12, 13, 28, 16, 32, 36, 70, 6, 15, 17, 33, 20, 39, 43, 76, 22, 45, 51, 84, 58, 92, 97, 165, 7, 18, 21, 41, 24, 47, 53, 89, 30, 57, 61, 100, 69, 108, 116, 168, 35, 63, 73, 113, 78, 124, 131, 188, 85, 137, 144, 203, 146, 220, 227, 315, 10, 23, 25, 56, 31, 60, 64, 107, 37, 72, 77, 117, 82, 126, 141, 198, 42, 80, 86, 132, 93, 145, 147, 219, 101, 151, 158, 228, 176, 243, 260, 355, 49, 90, 98, 149, 105, 159, 166, 235, 123, 177, 187, 255, 200, 272, 276, 372, 138, 194, 205, 275, 218, 288, 301, 403, 240, 308, 325, 412, 335, 429, 461, 535, 14, 29, 34, 71, 40, 79, 83, 136, 46, 87, 94, 148, 102, 156, 161, 231, 50, 96, 104, 160, 114, 174, 186, 250, 125, 189, 201, 273, 210, 286, 297, 388, 59, 109, 119, 185, 129, 199, 206, 282, 142, 212, 214, 289, 237, 307, 318, 408, 157, 221, 241, 310, 257, 333, 338, 444, 267, 349, 356, 454, 384, 479, 506, 589, 66, 128, 139, 211, 150, 213, 234, 309, 171, 239, 254, 324, 261, 334, 352, 450, 178, 258, 268, 347, 283, 365, 381, 466, 294, 389, 405, 495, 415, 520, 527, 640, 190, 287, 291, 378, 311, 394, 410, 511, 319, 422, 426, 526, 460, 537, 562, 668, 357, 449, 462, 561, 486, 575, 590, 691, 512, 595, 616, 696, 628, 715, 744, 811, 19, 38, 44, 88, 48, 95, 103, 167, 55, 106, 118, 181, 127, 193, 204, 299, 65, 120, 130, 202, 143, 215, 217, 304, 153, 222, 238, 317, 256, 332, 339, 427, 74, 140, 152, 216, 170, 233, 242, 331, 175, 253, 262, 345, 271, 353, 368, 474, 184, 270, 284, 367, 293, 383, 402, 505, 313, 411, 418, 519, 447, 529, 551, 666, 81, 169, 172, 251, 183, 266, 274, 363, 192, 285, 290, 380, 305, 404, 414, 514, 236, 296, 312, 413, 320, 430, 437, 528, 351, 448, 463, 557, 481, 574, 588, 681, 263, 322, 346, 436, 366, 452, 473, 565, 390, 477, 493, 587, 513, 596, 618, 712, 393, 503, 521, 615, 531, 621, 649, 726, 560, 663, 671, 751, 679, 774, 792, 851, 91, 182, 191, 292, 232, 306, 314, 409, 252, 316, 323, 431, 350, 445, 464, 559, 269, 348, 364, 451, 382, 472, 485, 586, 392, 487, 510, 593, 524, 617, 627, 723, 295, 379, 391, 484, 396, 496, 515, 614, 417, 522, 533, 626, 558, 651, 669, 750, 446, 549, 564, 664, 591, 675, 680, 771, 608, 692, 695, 794, 725, 795, 803, 880, 321, 395, 416, 523, 428, 536, 552, 652, 480, 563, 576, 670, 594, 678, 693, 777, 482, 592, 613, 690, 619, 694, 722, 796, 639, 727, 740, 812, 759, 836, 847, 906, 525, 620, 638, 724, 650, 730, 754, 819, 674, 762, 772, 846, 776, 852, 857, 925, 682, 775, 793, 853, 818, 859, 882, 931, 821, 891, 893, 946, 912, 956, 964, 985, 26, 52, 54, 99, 62, 110, 112, 195, 67, 115, 121, 207, 134, 223, 226, 340, 68, 133, 135, 225, 162, 244, 246, 358, 164, 259, 280, 373, 302, 397, 406, 530, 75, 154, 163, 248, 179, 278, 281, 385, 196, 303, 327, 419, 328, 434, 440, 538, 209, 329, 344, 438, 360, 456, 470, 566, 374, 475, 491, 582, 494, 599, 612, 746, 111, 173, 180, 300, 208, 330, 341, 433, 229, 343, 359, 455, 370, 469, 488, 577, 247, 362, 375, 476, 398, 492, 497, 597, 420, 501, 509, 611, 545, 637, 654, 761, 265, 386, 407, 499, 425, 516, 532, 629, 441, 546, 567, 646, 579, 667, 677, 773, 458, 573, 584, 676, 607, 689, 707, 785, 634, 713, 731, 806, 742, 820, 839, 914, 122, 197, 224, 342, 245, 361, 371, 471, 264, 376, 399, 498, 421, 507, 518, 622, 279, 401, 424, 517, 439, 543, 556, 641, 457, 568, 580, 672, 600, 687, 705, 778, 326, 435, 443, 555, 467, 578, 585, 683, 489, 601, 606, 697, 631, 711, 721, 804, 508, 609, 635, 716, 648, 738, 743, 823, 659, 752, 763, 837, 786, 855, 871, 927, 337, 465, 478, 598, 500, 605, 625, 714, 541, 633, 645, 737, 655, 745, 758, 833, 547, 653, 660, 755, 684, 767, 784, 848, 702, 791, 802, 865, 813, 878, 887, 940, 569, 688, 699, 781, 717, 800, 808, 873, 732, 817, 828, 886, 838, 895, 904, 950, 764, 832, 843, 900, 862, 910, 917, 962, 869, 922, 930, 967, 939, 975, 984, 1004, 155, 230, 249, 377, 277, 400, 423, 534, 298, 432, 442, 548, 459, 572, 583, 706, 336, 453, 468, 581, 490, 602, 604, 708, 504, 610, 632, 729, 647, 741, 747, 822, 354, 483, 502, 603, 540, 624, 636, 739, 544, 644, 656, 748, 665, 760, 770, 840, 554, 662, 685, 769, 701, 783, 799, 870, 719, 807, 816, 877, 830, 894, 898, 949, 369, 539, 542, 642, 553, 658, 673, 765, 571, 686, 698, 780, 709, 801, 810, 875, 630, 704, 718, 809, 733, 824, 827, 888, 757, 831, 844, 897, 858, 909, 916, 961, 657, 735, 749, 826, 768, 835, 850, 903, 787, 854, 864, 915, 874, 923, 933, 970, 790, 868, 879, 928, 889, 936, 941, 977, 905, 947, 954, 982, 959, 990, 992, 1012, 387, 550, 570, 700, 623, 710, 720, 805, 643, 728, 736, 825, 756, 829, 845, 902, 661, 753, 766, 834, 782, 849, 861, 913, 789, 863, 872, 920, 884, 932, 938, 973, 703, 779, 788, 860, 798, 867, 876, 926, 815, 881, 890, 937, 901, 943, 951, 981, 842, 896, 908, 948, 918, 957, 960, 988, 929, 966, 969, 994, 976, 997, 999, 1013, 734, 797, 814, 883, 841, 892, 899, 944, 856, 907, 911, 953, 921, 958, 968, 991, 866, 919, 924, 965, 934, 971, 972, 998, 945, 978, 980, 1000, 986, 1005, 1007, 1017, 885, 935, 942, 974, 952, 979, 983, 1002, 955, 987, 989, 1006, 995, 1008, 1010, 1019, 963, 993, 996, 1009, 1001, 1011, 1014, 1020, 1003, 1015, 1016, 1021, 1018, 1022, 1023, 1024].

When N=1024, the sorted sequence is a Q sequence, and is denoted as a sequence (3):

[1, 2, 3, 5, 9, 17, 33, 4, 6, 65, 7, 10, 11, 129, 18, 13, 19, 34, 257, 21, 35, 25, 66, 37, 67, 513, 8, 12, 130, 41, 69, 14, 20, 131, 49, 15, 73, 258, 22, 133, 36, 81, 23, 259, 26, 137, 38, 261, 97, 145, 27, 514, 39, 515, 265, 68, 42, 29, 161, 70, 43, 517, 50, 71, 273, 45, 521, 529, 16, 132, 74, 193, 51, 289, 545, 24, 75, 53, 134, 82, 321, 77, 135, 28, 57, 83, 138, 260, 40, 98, 385, 85, 30, 139, 262, 146, 31, 99, 516, 44, 89, 141, 263, 147, 101, 266, 72, 46, 162, 518, 577, 519, 52, 149, 522, 47, 76, 267, 163, 274, 523, 641, 105, 54, 153, 78, 269, 194, 165, 275, 55, 84, 530, 525, 531, 136, 58, 113, 195, 290, 79, 169, 277, 59, 86, 100, 87, 140, 61, 197, 90, 291, 281, 546, 769, 142, 177, 91, 102, 148, 143, 533, 547, 537, 32, 103, 264, 106, 322, 293, 201, 323, 578, 150, 297, 48, 93, 209, 549, 579, 268, 386, 325, 305, 164, 151, 107, 56, 154, 225, 387, 329, 270, 114, 520, 553, 642, 80, 166, 109, 155, 276, 60, 271, 115, 167, 524, 581, 561, 157, 196, 170, 198, 171, 278, 292, 279, 117, 88, 62, 178, 282, 526, 643, 532, 527, 63, 92, 585, 770, 144, 389, 294, 199, 104, 337, 173, 283, 202, 121, 179, 295, 94, 534, 645, 535, 593, 548, 771, 152, 324, 393, 298, 203, 108, 285, 181, 210, 538, 95, 205, 299, 353, 649, 609, 326, 185, 211, 401, 306, 301, 110, 156, 327, 116, 111, 773, 550, 657, 539, 551, 168, 213, 307, 330, 158, 226, 118, 172, 331, 227, 388, 309, 217, 417, 338, 159, 777, 272, 580, 119, 541, 554, 280, 333, 390, 174, 122, 200, 180, 229, 339, 313, 391, 64, 394, 284, 175, 123, 341, 449, 354, 395, 233, 204, 673, 555, 557, 562, 582, 296, 286, 182, 206, 125, 785, 705, 183, 287, 528, 583, 644, 586, 563, 300, 355, 212, 402, 186, 397, 345, 207, 302, 801, 96, 187, 241, 536, 587, 565, 646, 594, 328, 403, 214, 357, 308, 303, 833, 589, 647, 112, 540, 569, 595, 650, 772, 228, 418, 332, 215, 405, 310, 189, 552, 610, 897, 160, 218, 361, 419, 409, 369, 230, 450, 421, 542, 597, 651, 774, 658, 311, 120, 334, 219, 543, 611, 231, 392, 234, 314, 176, 340, 335, 221, 451, 425, 315, 556, 601, 653, 124, 775, 659, 613, 235, 288, 453, 126, 342, 396, 778, 584, 558, 674, 356, 343, 564, 661, 559, 617, 779, 675, 184, 398, 433, 317, 346, 242, 208, 404, 358, 786, 188, 588, 566, 665, 625, 781, 237, 127, 243, 347, 399, 706, 216, 677, 787, 590, 567, 648, 406, 359, 304, 570, 596, 362, 707, 190, 457, 349, 465, 802, 420, 407, 245, 410, 591, 681, 789, 571, 598, 363, 573, 220, 422, 599, 652, 612, 709, 602, 803, 370, 793, 312, 191, 654, 689, 603, 411, 232, 249, 365, 336, 423, 614, 660, 655, 316, 222, 371, 426, 452, 413, 481, 236, 223, 344, 318, 544, 373, 615, 427, 776, 128, 454, 238, 560, 834, 805, 713, 835, 662, 809, 605, 618, 721, 780, 434, 898, 319, 455, 837, 817, 676, 663, 348, 429, 400, 377, 244, 239, 458, 435, 360, 568, 619, 666, 737, 899, 841, 782, 626, 350, 246, 459, 592, 678, 621, 667, 788, 572, 783, 627, 679, 408, 364, 351, 192, 247, 437, 466, 412, 461, 250, 366, 800, 708, 574, 669, 682, 790, 804, 791, 710, 683, 629, 441, 690, 794, 604, 575, 467, 424, 372, 251, 482, 414, 469, 367, 374, 656, 901, 806, 711, 428, 415, 253, 616, 849, 685, 795, 714, 633, 691, 807, 606, 483, 473, 224, 664, 836, 905, 810, 715, 620, 797, 693, 375, 485, 430, 456, 722, 607, 717, 811, 865, 838, 697, 723, 913, 818, 378, 436, 813, 320, 622, 240, 431, 460, 379, 668, 839, 489, 438, 628, 623, 462, 381, 439, 352, 497, 680, 725, 819, 842, 670, 738, 630, 468, 248, 442, 463, 470, 443, 252, 684, 843, 739, 900, 821, 729, 929, 850, 671, 784, 631, 792, 845, 902, 686, 368, 634, 712, 254, 692, 741, 851, 825, 903, 687, 471, 416, 484, 445, 376, 474, 906, 796, 486, 635, 745, 853, 961, 866, 907, 716, 694, 808, 475, 798, 637, 695, 255, 718, 576, 799, 812, 867, 432, 380, 698, 914, 487, 724, 909, 857, 719, 477, 814, 608, 490, 699, 753, 840, 915, 726, 869, 820, 815, 440, 491, 624, 382, 498, 493, 464, 672, 930, 844, 740, 917, 822, 727, 632, 701, 873, 931, 921, 881, 730, 383, 499, 444, 446, 472, 962, 933, 823, 742, 846, 731, 447, 688, 904, 636, 826, 743, 852, 847, 256, 476, 733, 963, 937, 827, 746, 501, 488, 638, 505, 800, 696, 854, 908, 868, 855, 747, 910, 829, 858, 754, 720, 916, 870, 478, 700, 749, 639, 816, 965, 945, 755, 859, 911, 492, 479, 728, 918, 871, 384, 494, 500, 874, 702, 969, 495, 861, 502, 932, 919, 757, 922, 875, 732, 977, 934, 882, 761, 824, 703, 923, 744, 877, 848, 935, 828, 734, 883, 448, 938, 503, 964, 925, 993, 748, 735, 856, 885, 939, 506, 966, 507, 830, 750, 946, 860, 831, 967, 756, 941, 912, 872, 751, 889, 480, 970, 947, 862, 758, 971, 509, 920, 640, 876, 863, 759, 949, 978, 924, 973, 762, 878, 979, 496, 936, 704, 884, 953, 763, 504, 926, 879, 981, 994, 886, 940, 927, 765, 736, 887, 995, 942, 968, 985, 508, 890, 948, 832, 752, 943, 997, 972, 891, 1001, 510, 950, 974, 893, 951, 864, 760, 1009, 511, 980, 954, 764, 975, 955, 880, 982, 983, 928, 996, 766, 957, 888, 986, 998, 987, 944, 892, 999, 767, 512, 989, 1002, 952, 1003, 894, 976, 895, 1010, 956, 1005, 1011, 958, 984, 959, 988, 1013, 1000, 1017, 768, 990, 1004, 991, 1006, 1012, 1007, 1014, 896, 960, 1015, 1018, 1019, 992, 1021, 1008, 1016, 1020, 1022, 1023, 1024].

When N=1024, the sorted sequence is a Z sequence, and is denoted as a sequence (4):

[1, 2, 3, 8, 4, 9, 11, 27, 5, 12, 13, 28, 16, 32, 36, 69, 6, 15, 17, 33, 20, 39, 43, 76, 22, 45, 51, 84, 58, 93, 97, 165, 7, 18, 21, 41, 24, 47, 53, 89, 30, 57, 61, 100, 66, 108, 116, 176, 35, 63, 73, 113, 78, 124, 131, 188, 85, 137, 144, 203, 149, 220, 227, 315, 10, 23, 25, 56, 31, 60, 64, 107, 37, 71, 77, 117, 82, 126, 141, 198, 42, 80, 86, 132, 92, 145, 147, 219, 101, 151, 158, 228, 177, 243, 260, 355, 49, 90, 98, 146, 105, 159, 166, 235, 123, 168, 187, 255, 200, 272, 276, 372, 138, 194, 205, 275, 218, 288, 301, 403, 240, 308, 319, 422, 335, 429, 461, 535, 14, 29, 34, 70, 40, 79, 83, 136, 46, 87, 94, 148, 102, 156, 161, 231, 50, 96, 104, 160, 114, 174, 186, 250, 125, 189, 201, 273, 210, 286, 297, 388, 59, 109, 119, 185, 129, 199, 206, 282, 142, 212, 214, 289, 237, 307, 318, 412, 157, 221, 241, 310, 257, 333, 338, 444, 267, 349, 356, 454, 384, 479, 506, 589, 72, 128, 139, 211, 150, 213, 234, 309, 171, 239, 254, 325, 261, 334, 352, 450, 178, 258, 268, 347, 283, 365, 381, 466, 294, 389, 405, 495, 415, 520, 527, 640, 190, 287, 291, 378, 311, 394, 408, 511, 324, 410, 426, 526, 460, 537, 562, 668, 357, 449, 462, 561, 486, 575, 590, 691, 512, 595, 616, 696, 628, 715, 744, 811, 19, 38, 44, 88, 48, 95, 103, 167, 55, 106, 118, 181, 127, 193, 204, 299, 65, 120, 130, 202, 143, 215, 217, 304, 153, 222, 238, 317, 256, 332, 339, 427, 74, 140, 152, 216, 170, 233, 242, 331, 175, 253, 262, 345, 271, 353, 368, 474, 184, 270, 284, 367, 293, 383, 402, 505, 313, 411, 418, 519, 447, 529, 551, 666, 81, 169, 172, 251, 183, 266, 274, 363, 192, 285, 290, 380, 305, 404, 414, 514, 236, 296, 312, 413, 320, 430, 437, 528, 351, 448, 463, 557, 481, 574, 588, 681, 263, 322, 346, 436, 366, 452, 473, 565, 390, 477, 493, 587, 513, 596, 620, 712, 393, 503, 521, 615, 531, 621, 649, 726, 560, 663, 671, 751, 679, 774, 792, 851, 91, 182, 191, 292, 232, 306, 314, 409, 252, 316, 323, 431, 350, 445, 464, 559, 269, 348, 364, 451, 382, 472, 485, 586, 392, 487, 510, 593, 524, 618, 627, 723, 295, 379, 391, 484, 396, 496, 515, 614, 417, 522, 533, 626, 558, 651, 669, 750, 446, 549, 564, 664, 591, 675, 680, 771, 608, 692, 695, 794, 725, 795, 803, 880, 321, 395, 416, 523, 428, 536, 552, 652, 480, 563, 576, 670, 594, 678, 693, 777, 482, 592, 613, 690, 619, 694, 722, 796, 639, 727, 740, 812, 759, 836, 847, 906, 525, 617, 638, 724, 650, 730, 754, 819, 674, 762, 772, 846, 776, 852, 857, 925, 682, 775, 793, 853, 818, 859, 882, 931, 821, 891, 893, 946, 912, 956, 964, 985, 26, 52, 54, 99, 62, 110, 112, 195, 67, 115, 121, 207, 134, 223, 226, 340, 68, 133, 135, 225, 162, 244, 246, 358, 164, 259, 280, 373, 302, 397, 406, 530, 75, 154, 163, 248, 179, 278, 281, 385, 196, 303, 327, 419, 328, 434, 440, 538, 209, 329, 344, 438, 360, 456, 470, 566, 374, 475, 491, 582, 494, 599, 612, 746, 111, 173, 180, 300, 208, 330, 341, 433, 229, 343, 359, 455, 370, 469, 488, 577, 247, 362, 375, 476, 398, 492, 497, 597, 420, 501, 509, 611, 545, 637, 654, 761, 265, 386, 407, 499, 425, 516, 532, 629, 441, 546, 567, 646, 579, 667, 677, 773, 458, 573, 584, 676, 607, 689, 707, 785, 634, 713, 731, 806, 742, 820, 839, 914, 122, 197, 224, 342, 245, 361, 371, 471, 264, 376, 399, 498, 421, 507, 518, 622, 279, 401, 424, 517, 439, 543, 556, 641, 457, 568, 580, 672, 600, 687, 705, 778, 326, 435, 443, 555, 467, 578, 585, 683, 489, 601, 606, 697, 631, 711, 721, 804, 508, 609, 635, 716, 648, 738, 743, 823, 659, 752, 763, 837, 786, 855, 871, 927, 337, 465, 478, 598, 500, 605, 625, 714, 541, 633, 645, 737, 655, 745, 758, 833, 547, 653, 660, 755, 684, 767, 784, 848, 702, 791, 802, 865, 813, 878, 887, 940, 569, 688, 699, 781, 717, 800, 808, 873, 732, 817, 828, 886, 838, 895, 904, 950, 764, 832, 843, 900, 862, 910, 917, 962, 869, 922, 930, 967, 939, 975, 984, 1004, 155, 230, 249, 377, 277, 400, 423, 534, 298, 432, 442, 548, 459, 572, 583, 706, 336, 453, 468, 581, 490, 602, 604, 708, 504, 610, 632, 729, 647, 741, 747, 822, 354, 483, 502, 603, 540, 624, 636, 739, 544, 644, 656, 748, 665, 760, 770, 840, 554, 662, 685, 769, 701, 783, 799, 870, 719, 807, 816, 877, 830, 894, 898, 949, 369, 539, 542, 642, 553, 658, 673, 765, 571, 686, 698, 780, 709, 801, 810, 875, 630, 704, 718, 809, 733, 824, 827, 888, 757, 831, 844, 897, 858, 909, 916, 961, 657, 735, 749, 826, 768, 835, 850, 903, 787, 854, 864, 915, 874, 923, 933, 970, 790, 868, 879, 928, 889, 936, 941, 977, 905, 947, 954, 982, 959, 990, 992, 1012, 387, 550, 570, 700, 623, 710, 720, 805, 643, 728, 736, 825, 756, 829, 845, 902, 661, 753, 766, 834, 782, 849, 861, 913, 789, 863, 872, 920, 884, 932, 938, 973, 703, 779, 788, 860, 798, 867, 876, 926, 815, 881, 890, 937, 901, 943, 951, 981, 842, 896, 908, 948, 918, 957, 960, 988, 929, 966, 969, 994, 976, 997, 999, 1013, 734, 797, 814, 883, 841, 892, 899, 944, 856, 907, 911, 953, 921, 958, 968, 991, 866, 919, 924, 965, 934, 971, 972, 998, 945, 978, 980, 1000, 986, 1005, 1007, 1017, 885, 935, 942, 974, 952, 979, 983, 1002, 955, 987, 989, 1006, 995, 1008, 1010, 1019, 963, 993, 996, 1009, 1001, 1011, 1014, 1020, 1003, 1015, 1016, 1021, 1018, 1022, 1023, 1024].

When N=1024, the sorted sequence is a Q sequence, and is denoted as a sequence (5):

[1, 2, 5, 9, 3, 17, 33, 7, 65, 513, 4, 6, 10, 13, 129, 19, 34, 18, 11, 21, 35, 25, 257, 66, 37, 8, 67, 130, 12, 41, 14, 133, 514, 20, 69, 49, 15, 258, 73, 22, 131, 27, 81, 137, 259, 36, 39, 23, 38, 517, 97, 26, 68, 265, 42, 145, 29, 70, 261, 50, 43, 161, 75, 521, 71, 45, 82, 132, 273, 193, 16, 51, 74, 24, 53, 515, 135, 138, 289, 77, 134, 83, 28, 40, 260, 98, 529, 57, 139, 85, 30, 146, 262, 44, 321, 545, 99, 141, 266, 31, 89, 147, 263, 72, 519, 162, 46, 101, 385, 149, 52, 47, 577, 76, 267, 54, 274, 165, 194, 105, 516, 163, 269, 78, 153, 275, 55, 525, 58, 113, 136, 79, 86, 290, 518, 195, 84, 291, 169, 277, 59, 531, 140, 100, 323, 87, 61, 641, 197, 90, 177, 281, 148, 102, 522, 293, 142, 322, 143, 91, 546, 201, 32, 103, 264, 530, 106, 387, 48, 297, 523, 93, 150, 209, 154, 268, 164, 537, 769, 533, 325, 114, 151, 166, 107, 305, 56, 578, 276, 549, 270, 386, 155, 80, 109, 225, 167, 60, 579, 170, 115, 196, 329, 271, 278, 157, 547, 117, 88, 389, 520, 337, 292, 279, 198, 642, 62, 178, 171, 553, 199, 282, 144, 63, 524, 92, 173, 295, 585, 202, 393, 104, 645, 121, 294, 283, 532, 353, 179, 203, 561, 324, 298, 94, 581, 210, 181, 152, 526, 285, 108, 401, 770, 95, 205, 299, 527, 327, 156, 534, 306, 110, 326, 643, 211, 116, 185, 539, 111, 301, 593, 168, 388, 330, 548, 226, 417, 771, 158, 272, 213, 551, 307, 118, 649, 172, 227, 331, 609, 338, 390, 535, 309, 217, 550, 159, 391, 538, 119, 280, 333, 580, 174, 122, 777, 339, 180, 554, 200, 657, 354, 284, 541, 313, 449, 582, 229, 394, 773, 64, 175, 673, 555, 785, 395, 562, 204, 182, 341, 583, 557, 123, 296, 286, 233, 125, 183, 212, 287, 300, 355, 206, 402, 186, 397, 587, 345, 594, 647, 528, 96, 563, 241, 644, 207, 705, 328, 586, 403, 536, 214, 357, 308, 419, 565, 801, 589, 187, 302, 646, 112, 569, 303, 595, 361, 228, 650, 772, 418, 540, 215, 405, 310, 189, 450, 332, 218, 610, 597, 552, 651, 160, 230, 120, 334, 409, 311, 421, 219, 542, 369, 658, 340, 774, 231, 392, 556, 176, 833, 314, 221, 611, 653, 335, 451, 778, 124, 543, 342, 601, 425, 315, 659, 234, 775, 184, 613, 356, 674, 126, 396, 584, 235, 558, 317, 564, 661, 242, 779, 559, 343, 346, 617, 675, 897, 404, 288, 398, 188, 208, 453, 433, 786, 237, 588, 566, 665, 781, 347, 362, 127, 243, 358, 706, 406, 677, 590, 216, 399, 567, 304, 598, 359, 802, 420, 625, 457, 787, 349, 190, 570, 245, 591, 411, 648, 220, 707, 312, 596, 363, 803, 465, 681, 407, 789, 422, 599, 232, 571, 370, 652, 249, 835, 410, 709, 191, 614, 316, 573, 365, 660, 423, 336, 222, 689, 452, 793, 371, 612, 426, 602, 236, 805, 413, 654, 481, 834, 223, 713, 344, 603, 318, 544, 427, 655, 454, 615, 373, 776, 434, 560, 238, 899, 618, 348, 809, 244, 721, 455, 666, 319, 605, 377, 662, 429, 780, 239, 676, 360, 837, 400, 626, 246, 663, 678, 435, 568, 458, 817, 350, 619, 459, 788, 408, 782, 898, 128, 667, 364, 592, 466, 621, 437, 737, 247, 679, 572, 250, 682, 351, 627, 461, 708, 841, 412, 783, 366, 790, 441, 600, 424, 669, 629, 467, 901, 251, 849, 804, 372, 791, 192, 710, 482, 574, 690, 414, 683, 367, 604, 794, 469, 714, 374, 711, 428, 575, 656, 253, 807, 415, 685, 905, 483, 616, 224, 633, 806, 375, 795, 865, 430, 691, 456, 715, 836, 473, 810, 378, 606, 620, 436, 664, 722, 320, 797, 431, 693, 913, 240, 607, 717, 485, 811, 379, 839, 668, 438, 818, 622, 460, 838, 723, 248, 697, 381, 738, 680, 462, 813, 628, 489, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 446, 727, 962, 844, 464, 632, 730, 701, 491, 742, 846, 921, 383, 823, 852, 731, 472, 881, 743, 498, 904, 826, 444, 688, 476, 636, 933, 847, 963, 733, 937, 501, 854, 827, 447, 746, 638, 868, 800, 908, 488, 696, 747, 829, 858, 754, 855, 916, 494, 910, 720, 478, 749, 965, 945, 639, 870, 911, 700, 859, 505, 755, 728, 918, 871, 479, 500, 874, 932, 969, 702, 816, 861, 256, 757, 492, 875, 824, 732, 923, 977, 919, 934, 744, 761, 882, 503, 703, 922, 828, 877, 935, 848, 734, 964, 883, 495, 938, 748, 506, 925, 993, 856, 735, 384, 502, 966, 939, 885, 830, 750, 946, 860, 756, 480, 967, 831, 889, 941, 751, 872, 507, 971, 912, 758, 947, 970, 862, 978, 448, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024].

When N=1024, the sorted sequence is a Z sequence, and is denoted as a sequence (6):

[1, 2, 5, 9, 3, 17, 33, 7, 65, 513, 4, 6, 10, 13, 129, 19, 34, 18, 11, 21, 35, 25, 257, 66, 37, 8, 67, 130, 12, 41, 14, 133, 514, 20, 69, 49, 15, 258, 73, 22, 131, 27, 81, 137, 259, 36, 39, 23, 38, 517, 97, 26, 68, 265, 42, 145, 29, 70, 261, 50, 43, 161, 75, 521, 71, 45, 82, 132, 273, 193, 16, 51, 74, 24, 53, 515, 135, 138, 289, 77, 134, 83, 28, 40, 260, 98, 529, 57, 139, 85, 30, 146, 262, 44, 321, 545, 99, 141, 266, 31, 89, 147, 263, 72, 519, 162, 46, 101, 385, 149, 52, 47, 577, 76, 267, 54, 274, 165, 194, 105, 516, 163, 269, 78, 153, 275, 55, 525, 58, 113, 136, 79, 86, 290, 518, 195, 84, 291, 169, 277, 59, 531, 140, 100, 323, 87, 61, 641, 197, 90, 177, 281, 148, 102, 522, 293, 142, 322, 143, 91, 546, 201, 32, 103, 264, 530, 106, 387, 48, 297, 523, 93, 150, 209, 154, 268, 164, 537, 769, 533, 325, 114, 151, 166, 107, 305, 56, 578, 276, 549, 270, 386, 155, 80, 109, 225, 167, 60, 579, 170, 115, 196, 329, 271, 278, 157, 547, 117, 88, 389, 520, 337, 292, 279, 198, 642, 62, 178, 171, 553, 199, 282, 144, 63, 524, 92, 173, 295, 585, 202, 393, 104, 645, 121, 294, 283, 532, 353, 179, 203, 561, 324, 298, 94, 581, 210, 181, 152, 526, 285, 108, 401, 770, 95, 205, 299, 527, 327, 156, 534, 306, 110, 326, 643, 211, 116, 185, 539, 111, 301, 593, 168, 388, 330, 548, 226, 417, 771, 158, 272, 213, 551, 307, 118, 649, 172, 227, 331, 609, 338, 390, 535, 309, 217, 550, 159, 391, 538, 119, 280, 333, 580, 174, 122, 777, 339, 180, 554, 200, 657, 354, 284, 541, 313, 449, 582, 229, 394, 773, 64, 175, 673, 555, 785, 395, 562, 204, 182, 341, 583, 557, 123, 296, 286, 233, 125, 183, 212, 287, 300, 355, 206, 402, 186, 397, 587, 345, 594, 647, 528, 96, 563, 241, 644, 207, 705, 328, 586, 403, 536, 214, 357, 308, 419, 565, 801, 589, 187, 302, 646, 112, 569, 303, 595, 361, 228, 650, 772, 418, 540, 215, 405, 310, 189, 450, 332, 218, 610, 597, 552, 651, 160, 230, 120, 334, 409, 311, 421, 219, 542, 369, 658, 340, 774, 231, 392, 556, 176, 833, 314, 221, 611, 653, 335, 451, 778, 124, 543, 342, 601, 425, 315, 659, 234, 775, 184, 613, 356, 674, 126, 396, 584, 235, 558, 317, 564, 661, 242, 779, 559, 343, 346, 617, 675, 897, 404, 288, 398, 188, 208, 453, 433, 786, 237, 588, 566, 665, 781, 347, 362, 127, 243, 358, 706, 406, 677, 590, 216, 399, 567, 304, 598, 359, 802, 420, 625, 457, 787, 349, 190, 570, 245, 591, 411, 648, 220, 707, 312, 596, 363, 803, 465, 681, 407, 789, 422, 599, 232, 571, 370, 652, 249, 835, 410, 709, 191, 614, 316, 573, 365, 660, 423, 336, 222, 689, 452, 793, 371, 612, 426, 602, 236, 805, 413, 654, 481, 834, 223, 713, 344, 603, 318, 544, 427, 655, 454, 615, 373, 776, 434, 560, 238, 899, 618, 348, 809, 244, 721, 455, 666, 319, 605, 377, 662, 429, 780, 239, 676, 360, 837, 400, 626, 246, 663, 678, 435, 568, 458, 817, 350, 619, 459, 788, 408, 782, 898, 128, 667, 364, 592, 466, 621, 437, 737, 247, 679, 572, 250, 682, 351, 627, 461, 708, 841, 412, 783, 366, 790, 441, 600, 424, 669, 629, 467, 901, 251, 849, 804, 372, 791, 192, 710, 482, 574, 690, 414, 683, 367, 604, 794, 469, 714, 374, 711, 428, 575, 656, 253, 807, 415, 685, 905, 483, 616, 224, 633, 806, 375, 795, 865, 430, 691, 456, 715, 836, 473, 810, 378, 606, 620, 436, 664, 722, 320, 797, 431, 693, 913, 240, 607, 717, 485, 811, 379, 839, 668, 438, 818, 622, 460, 838, 723, 248, 697, 381, 738, 680, 462, 813, 628, 489, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 446, 727, 962, 844, 464, 632, 730, 701, 491, 742, 846, 921, 383, 823, 852, 731, 472, 881, 743, 498, 904, 826, 444, 688, 476, 636, 933, 847, 963, 733, 937, 501, 854, 827, 447, 746, 638, 868, 800, 908, 488, 696, 747, 829, 858, 754, 855, 916, 494, 910, 720, 478, 749, 965, 945, 639, 870, 911, 700, 859, 505, 755, 728, 918, 871, 479, 500, 874, 932, 969, 702, 816, 861, 256, 757, 492, 875, 824, 732, 923, 977, 919, 934, 744, 761, 882, 503, 703, 922, 828, 877, 935, 848, 734, 964, 883, 495, 938, 748, 506, 925, 993, 856, 735, 384, 502, 966, 939, 885, 830, 750, 946, 860, 756, 480, 967, 831, 889, 941, 751, 872, 507, 971, 912, 758, 947, 970, 862, 978, 448, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024].

When N=1024, the sorted sequence is a Q sequence, and is denoted as a sequence (7):

[1, 2, 5, 9, 3, 17, 33, 7, 65, 513, 4, 13, 6, 19, 129, 10, 34, 18, 11, 25, 21, 35, 257, 66, 37, 8, 67, 130, 12, 41, 14, 133, 514, 20, 69, 49, 15, 258, 73, 22, 131, 81, 27, 36, 259, 137, 39, 97, 23, 517, 38, 26, 68, 265, 42, 145, 29, 70, 261, 43, 50, 161, 75, 521, 71, 45, 82, 132, 273, 193, 16, 51, 74, 24, 53, 515, 135, 138, 289, 77, 134, 83, 28, 40, 260, 98, 529, 57, 139, 85, 30, 146, 262, 44, 321, 545, 99, 141, 266, 31, 89, 147, 263, 72, 519, 162, 46, 101, 385, 149, 52, 47, 577, 76, 267, 54, 274, 165, 194, 105, 516, 163, 269, 78, 153, 275, 55, 525, 58, 113, 136, 79, 86, 290, 518, 195, 84, 291, 59, 277, 169, 531, 100, 140, 323, 197, 87, 641, 177, 61, 90, 281, 102, 148, 522, 293, 142, 322, 143, 91, 546, 201, 32, 103, 264, 530, 106, 387, 209, 297, 523, 48, 154, 93, 150, 268, 164, 537, 769, 533, 325, 114, 151, 166, 107, 305, 56, 578, 276, 549, 270, 386, 155, 80, 225, 167, 109, 115, 579, 170, 60, 196, 329, 271, 278, 157, 547, 88, 117, 389, 520, 337, 292, 279, 198, 642, 62, 178, 171, 553, 199, 282, 144, 63, 524, 92, 173, 295, 585, 202, 393, 104, 645, 121, 294, 283, 532, 353, 179, 203, 561, 324, 298, 94, 581, 152, 210, 181, 526, 285, 108, 401, 770, 95, 205, 299, 527, 327, 156, 534, 306, 110, 326, 643, 211, 116, 185, 539, 168, 301, 593, 226, 388, 330, 548, 111, 417, 771, 158, 272, 213, 551, 307, 118, 649, 172, 227, 331, 609, 338, 390, 535, 309, 217, 550, 159, 391, 538, 119, 280, 333, 580, 174, 122, 777, 339, 180, 554, 200, 657, 354, 284, 541, 313, 449, 582, 229, 394, 773, 123, 175, 673, 555, 785, 395, 562, 204, 182, 341, 583, 557, 64, 296, 286, 233, 125, 183, 212, 287, 300, 355, 206, 402, 186, 397, 587, 345, 594, 647, 528, 96, 563, 241, 644, 207, 705, 328, 586, 403, 536, 214, 357, 308, 419, 565, 801, 589, 187, 302, 646, 112, 569, 303, 595, 361, 228, 650, 772, 418, 540, 215, 405, 310, 189, 450, 332, 218, 610, 597, 552, 651, 160, 230, 120, 334, 409, 311, 421, 219, 542, 369, 658, 340, 774, 231, 392, 556, 176, 833, 314, 221, 611, 653, 335, 451, 778, 124, 543, 342, 601, 425, 315, 659, 234, 775, 184, 613, 356, 674, 126, 396, 584, 235, 558, 317, 564, 661, 242, 779, 559, 343, 346, 617, 675, 897, 404, 288, 398, 188, 453, 433, 208, 786, 237, 588, 566, 665, 781, 347, 362, 127, 243, 358, 706, 406, 677, 590, 216, 399, 567, 304, 598, 359, 802, 420, 625, 457, 787, 349, 245, 570, 190, 591, 411, 648, 220, 707, 312, 596, 363, 803, 465, 681, 407, 789, 422, 599, 249, 571, 370, 652, 191, 835, 410, 709, 232, 614, 316, 573, 365, 660, 423, 336, 222, 689, 452, 793, 371, 612, 426, 602, 236, 805, 413, 654, 481, 834, 223, 713, 344, 603, 454, 544, 318, 655, 427, 615, 373, 776, 434, 560, 238, 899, 618, 348, 809, 244, 721, 455, 666, 319, 605, 377, 662, 429, 780, 239, 676, 360, 837, 400, 626, 246, 663, 678, 435, 568, 458, 817, 350, 619, 459, 788, 408, 782, 898, 128, 667, 364, 592, 466, 621, 437, 737, 247, 679, 572, 250, 682, 351, 627, 461, 708, 841, 412, 783, 366, 790, 441, 600, 424, 669, 629, 467, 901, 251, 849, 804, 372, 791, 192, 710, 482, 574, 690, 414, 683, 367, 604, 794, 469, 714, 374, 711, 253, 575, 656, 415, 807, 483, 685, 905, 375, 616, 224, 633, 806, 428, 795, 865, 430, 691, 456, 715, 836, 473, 810, 378, 606, 620, 436, 664, 722, 320, 797, 431, 693, 913, 240, 607, 717, 485, 811, 379, 839, 668, 438, 818, 622, 460, 838, 723, 248, 697, 381, 738, 680, 462, 813, 628, 489, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 826, 501, 688, 446, 636, 933, 847, 963, 733, 937, 476, 854, 827, 447, 746, 868, 638, 800, 908, 488, 696, 747, 829, 858, 754, 855, 916, 965, 478, 910, 720, 505, 749, 945, 639, 870, 911, 700, 859, 479, 755, 918, 871, 256, 728, 494, 874, 932, 969, 702, 816, 861, 500, 757, 923, 492, 732, 824, 875, 977, 919, 934, 744, 761, 882, 495, 703, 922, 828, 877, 935, 848, 503, 734, 883, 938, 384, 964, 748, 925, 993, 506, 856, 735, 502, 830, 966, 939, 885, 946, 750, 860, 756, 480, 967, 831, 889, 941, 751, 872, 507, 971, 912, 758, 947, 970, 862, 978, 448, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024].

When N=1024, the sorted sequence is a Z sequence, and is denoted as a sequence (8):

[1, 2, 5, 9, 3, 17, 33, 7, 65, 513, 4, 13, 6, 19, 129, 10, 34, 18, 11, 25, 21, 35, 257, 66, 37, 8, 67, 130, 12, 41, 14, 133, 514, 20, 69, 49, 15, 258, 73, 22, 131, 81, 27, 36, 259, 137, 39, 97, 23, 517, 38, 26, 68, 265, 42, 145, 29, 70, 261, 43, 50, 161, 75, 521, 71, 45, 82, 132, 273, 193, 16, 51, 74, 24, 53, 515, 135, 138, 289, 77, 134, 83, 28, 40, 260, 98, 529, 57, 139, 85, 30, 146, 262, 44, 321, 545, 99, 141, 266, 31, 89, 147, 263, 72, 519, 162, 46, 101, 385, 149, 52, 47, 577, 76, 267, 54, 274, 165, 194, 105, 516, 163, 269, 78, 153, 275, 55, 525, 58, 113, 136, 79, 86, 290, 518, 195, 84, 291, 59, 277, 169, 531, 100, 140, 323, 197, 87, 641, 177, 61, 90, 281, 102, 148, 522, 293, 142, 322, 143, 91, 546, 201, 32, 103, 264, 530, 106, 387, 209, 297, 523, 48, 154, 93, 150, 268, 164, 537, 769, 533, 325, 114, 151, 166, 107, 305, 56, 578, 276, 549, 270, 386, 155, 80, 225, 167, 109, 115, 579, 170, 60, 196, 329, 271, 278, 157, 547, 88, 117, 389, 520, 337, 292, 279, 198, 642, 62, 178, 171, 553, 199, 282, 144, 63, 524, 92, 173, 295, 585, 202, 393, 104, 645, 121, 294, 283, 532, 353, 179, 203, 561, 324, 298, 94, 581, 152, 210, 181, 526, 285, 108, 401, 770, 95, 205, 299, 527, 327, 156, 534, 306, 110, 326, 643, 211, 116, 185, 539, 168, 301, 593, 226, 388, 330, 548, 111, 417, 771, 158, 272, 213, 551, 307, 118, 649, 172, 227, 331, 609, 338, 390, 535, 309, 217, 550, 159, 391, 538, 119, 280, 333, 580, 174, 122, 777, 339, 180, 554, 200, 657, 354, 284, 541, 313, 449, 582, 229, 394, 773, 123, 175, 673, 555, 785, 395, 562, 204, 182, 341, 583, 557, 64, 296, 286, 233, 125, 183, 212, 287, 300, 355, 206, 402, 186, 397, 587, 345, 594, 647, 528, 96, 563, 241, 644, 207, 705, 328, 586, 403, 536, 214, 357, 308, 419, 565, 801, 589, 187, 302, 646, 112, 569, 303, 595, 361, 228, 650, 772, 418, 540, 215, 405, 310, 189, 450, 332, 218, 610, 597, 552, 651, 160, 230, 120, 334, 409, 311, 421, 219, 542, 369, 658, 340, 774, 231, 392, 556, 176, 833, 314, 221, 611, 653, 335, 451, 778, 124, 543, 342, 601, 425, 315, 659, 234, 775, 184, 613, 356, 674, 126, 396, 584, 235, 558, 317, 564, 661, 242, 779, 559, 343, 346, 617, 675, 897, 404, 288, 398, 188, 453, 433, 208, 786, 237, 588, 566, 665, 781, 347, 362, 127, 243, 358, 706, 406, 677, 590, 216, 399, 567, 304, 598, 359, 802, 420, 625, 457, 787, 349, 245, 570, 190, 591, 411, 648, 220, 707, 312, 596, 363, 803, 465, 681, 407, 789, 422, 599, 249, 571, 370, 652, 191, 835, 410, 709, 232, 614, 316, 573, 365, 660, 423, 336, 222, 689, 452, 793, 371, 612, 426, 602, 236, 805, 413, 654, 481, 834, 223, 713, 344, 603, 454, 544, 318, 655, 427, 615, 373, 776, 434, 560, 238, 899, 618, 348, 809, 244, 721, 455, 666, 319, 605, 377, 662, 429, 780, 239, 676, 360, 837, 400, 626, 246, 663, 678, 435, 568, 458, 817, 350, 619, 459, 788, 408, 782, 898, 128, 667, 364, 592, 466, 621, 437, 737, 247, 679, 572, 250, 682, 351, 627, 461, 708, 841, 412, 783, 366, 790, 441, 600, 424, 669, 629, 467, 901, 251, 849, 804, 372, 791, 192, 710, 482, 574, 690, 414, 683, 367, 604, 794, 469, 714, 374, 711, 253, 575, 656, 415, 807, 483, 685, 905, 375, 616, 224, 633, 806, 428, 795, 865, 430, 691, 456, 715, 836, 473, 810, 378, 606, 620, 436, 664, 722, 320, 797, 431, 693, 913, 240, 607, 717, 485, 811, 379, 839, 668, 438, 818, 622, 460, 838, 723, 248, 697, 381, 738, 680, 462, 813, 628, 489, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 826, 501, 688, 446, 636, 933, 847, 963, 733, 937, 476, 854, 827, 447, 746, 868, 638, 800, 908, 488, 696, 747, 829, 858, 754, 855, 916, 965, 478, 910, 720, 505, 749, 945, 639, 870, 911, 700, 859, 479, 755, 918, 871, 256, 728, 494, 874, 932, 969, 702, 816, 861, 500, 757, 923, 492, 732, 824, 875, 977, 919, 934, 744, 761, 882, 495, 703, 922, 828, 877, 935, 848, 503, 734, 883, 938, 384, 964, 748, 925, 993, 506, 856, 735, 502, 830, 966, 939, 885, 946, 750, 860, 756, 480, 967, 831, 889, 941, 751, 872, 507, 971, 912, 758, 947, 970, 862, 978, 448, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024].

When N=1024, the sorted sequence is a Q sequence, and is denoted as a sequence (9):

[1, 2, 3, 5, 9, 17, 33, 4, 6, 65, 7, 10, 11, 129, 18, 13, 19, 34, 257, 21, 35, 25, 66, 37, 67, 513, 8, 12, 130, 41, 69, 14, 20, 131, 49, 15, 73, 258, 22, 133, 36, 81, 23, 259, 26, 137, 38, 261, 97, 145, 27, 514, 39, 515, 265, 68, 42, 29, 161, 70, 43, 517, 50, 75, 273, 193, 521, 529, 71, 45, 132, 16, 74, 289, 545, 51, 24, 53, 134, 82, 321, 77, 135, 28, 57, 83, 138, 260, 40, 98, 385, 30, 85, 139, 262, 146, 31, 99, 516, 44, 89, 141, 263, 147, 72, 266, 46, 101, 162, 518, 577, 519, 52, 149, 522, 47, 76, 267, 163, 274, 523, 641, 105, 54, 153, 78, 269, 194, 165, 275, 55, 84, 530, 525, 531, 136, 58, 113, 195, 290, 79, 169, 277, 59, 86, 61, 87, 140, 100, 197, 90, 291, 281, 546, 769, 142, 177, 91, 102, 148, 143, 533, 547, 537, 32, 103, 264, 106, 322, 293, 201, 323, 578, 150, 297, 48, 93, 209, 549, 579, 268, 386, 325, 305, 164, 151, 107, 56, 154, 225, 387, 329, 270, 114, 520, 553, 642, 80, 166, 109, 155, 276, 60, 271, 115, 167, 524, 581, 561, 157, 196, 170, 198, 171, 278, 292, 279, 117, 88, 62, 178, 282, 526, 643, 532, 527, 63, 92, 585, 770, 144, 389, 294, 199, 104, 337, 173, 283, 202, 121, 179, 295, 94, 534, 645, 535, 593, 548, 771, 152, 324, 393, 298, 203, 108, 285, 181, 210, 538, 95, 205, 299, 353, 649, 609, 326, 185, 211, 401, 306, 301, 110, 156, 327, 116, 111, 773, 550, 657, 539, 551, 168, 213, 307, 330, 158, 226, 118, 172, 331, 227, 388, 309, 217, 417, 338, 159, 777, 272, 580, 119, 541, 554, 280, 333, 390, 174, 122, 200, 180, 229, 339, 313, 391, 123, 394, 284, 64, 175, 341, 449, 354, 395, 233, 204, 673, 555, 557, 562, 582, 296, 286, 182, 206, 125, 785, 705, 183, 287, 528, 583, 644, 586, 563, 300, 355, 212, 402, 186, 397, 345, 207, 302, 801, 96, 187, 241, 536, 587, 565, 646, 594, 328, 403, 214, 357, 308, 303, 833, 589, 647, 112, 540, 569, 595, 650, 772, 228, 418, 332, 215, 405, 310, 189, 552, 610, 897, 160, 218, 361, 419, 409, 369, 230, 450, 421, 542, 597, 651, 774, 658, 311, 120, 334, 219, 543, 611, 176, 392, 231, 314, 124, 340, 335, 221, 451, 425, 315, 556, 601, 653, 234, 775, 659, 613, 235, 288, 453, 126, 342, 396, 778, 584, 558, 674, 356, 343, 564, 661, 559, 617, 779, 675, 184, 398, 433, 317, 346, 242, 208, 404, 358, 786, 188, 588, 566, 665, 625, 781, 237, 127, 243, 347, 399, 706, 216, 677, 787, 590, 567, 648, 406, 359, 304, 570, 596, 362, 707, 190, 457, 349, 465, 802, 420, 407, 245, 410, 591, 681, 789, 571, 598, 363, 573, 220, 422, 599, 652, 612, 709, 602, 803, 370, 793, 312, 191, 654, 689, 603, 411, 232, 249, 365, 336, 423, 614, 660, 655, 316, 222, 371, 426, 452, 413, 481, 236, 223, 344, 318, 544, 373, 615, 427, 776, 128, 454, 238, 560, 834, 805, 713, 835, 662, 809, 605, 618, 721, 780, 434, 898, 319, 455, 837, 817, 676, 663, 348, 429, 400, 377, 244, 239, 458, 435, 360, 568, 619, 666, 737, 899, 841, 782, 626, 350, 246, 459, 592, 678, 621, 667, 788, 572, 783, 627, 679, 408, 364, 351, 437, 192, 247, 466, 412, 461, 250, 366, 600, 708, 574, 669, 682, 790, 804, 791, 710, 683, 629, 441, 690, 794, 604, 575, 467, 424, 372, 251, 414, 367, 469, 482, 374, 656, 901, 806, 711, 428, 415, 253, 616, 849, 685, 795, 714, 633, 691, 807, 606, 483, 473, 224, 664, 836, 905, 810, 715, 620, 797, 693, 375, 485, 430, 456, 722, 607, 717, 811, 865, 838, 697, 723, 913, 818, 378, 436, 813, 320, 622, 240, 431, 460, 379, 668, 839, 489, 438, 628, 623, 462, 381, 439, 352, 497, 680, 725, 819, 842, 670, 738, 630, 468, 248, 442, 463, 470, 443, 252, 684, 843, 739, 900, 821, 729, 929, 850, 671, 784, 631, 792, 845, 902, 686, 368, 634, 712, 254, 692, 741, 851, 825, 903, 687, 471, 416, 484, 445, 376, 474, 906, 796, 486, 635, 745, 853, 961, 866, 907, 716, 694, 808, 475, 798, 637, 695, 255, 718, 576, 799, 812, 867, 432, 380, 698, 914, 487, 724, 909, 857, 719, 477, 814, 608, 490, 699, 753, 840, 915, 726, 869, 820, 815, 440, 491, 624, 382, 498, 493, 464, 672, 930, 844, 740, 917, 822, 727, 632, 701, 873, 931, 921, 881, 730, 383, 499, 444, 446, 472, 962, 933, 823, 742, 846, 731, 447, 688, 904, 636, 826, 743, 852, 847, 256, 476, 733, 963, 937, 688, 904, 636, 826, 743, 852, 847, 256, 476, 733, 963, 937, 827, 746, 501, 488, 638, 505, 800, 696, 854, 908, 868, 855, 747, 910, 829, 965, 858, 754, 720, 916, 870, 478, 700, 749, 639, 816, 945, 755, 859, 911, 492, 479, 728, 918, 871, 384, 494, 500, 874, 702, 969, 495, 861, 502, 932, 919, 757, 922, 875, 732, 977, 934, 882, 761, 824, 703, 923, 744, 877, 848, 935, 828, 734, 883, 448, 938, 503, 964, 925, 993, 748, 735, 856, 885, 939, 506, 966, 507, 830, 750, 946, 860, 831, 967, 756, 941, 912, 872, 751, 889, 480, 970, 947, 862, 758, 971, 509, 920, 640, 876, 863, 759, 949, 978, 924, 973, 762, 878, 979, 496, 936, 704, 884, 953, 763, 504, 926, 879, 981, 994, 886, 940, 927, 765, 736, 887, 995, 942, 968, 985, 508, 890, 948, 832, 752, 943, 997, 972, 891, 1001, 510, 950, 974, 893, 951, 864, 760, 1009, 511, 980, 954, 764, 975, 955, 880, 982, 983, 928, 996, 766, 957, 888, 986, 998, 987, 944, 892, 999, 767, 512, 989, 1002, 952, 1003, 894, 976, 895, 1010, 956, 1005, 1011, 958, 984, 959, 988, 1013, 1000, 1017, 768, 990, 1004, 991, 1006, 1012, 1007, 1014, 896, 960, 1015, 1018, 1019, 992, 1021, 1008, 1016, 1020, 1022, 1023, 1024].

When N=1024, the sorted sequence is a Z sequence, and is denoted as a sequence (10):

[1, 2, 3, 8, 4, 9, 11, 27, 5, 12, 13, 28, 16, 32, 36, 72, 6, 15, 17, 33, 20, 39, 43, 77, 22, 45, 51, 84, 58, 92, 97, 165, 7, 18, 21, 41, 24, 47, 53, 89, 30, 57, 61, 100, 70, 107, 116, 176, 35, 63, 76, 113, 78, 124, 131, 188, 85, 137, 144, 203, 146, 220, 227, 318, 10, 23, 25, 56, 31, 60, 69, 105, 37, 73, 64, 117, 82, 126, 141, 198, 42, 80, 86, 132, 93, 145, 147, 219, 101, 151, 158, 228, 177, 243, 260, 355, 49, 90, 98, 149, 108, 159, 166, 235, 123, 168, 187, 255, 200, 272, 276, 372, 138, 194, 205, 275, 218, 288, 301, 403, 240, 308, 315, 412, 335, 429, 461, 535, 14, 29, 34, 71, 40, 79, 83, 136, 46, 87, 94, 148, 102, 156, 161, 231, 50, 96, 104, 160, 114, 174, 186, 250, 125, 189, 201, 273, 210, 286, 297, 388, 59, 109, 119, 185, 129, 199, 206, 282, 142, 212, 214, 289, 237, 307, 319, 408, 157, 221, 241, 310, 257, 333, 338, 444, 267, 349, 356, 454, 384, 479, 506, 590, 66, 128, 139, 211, 150, 213, 234, 309, 171, 239, 254, 325, 261, 334, 352, 450, 178, 258, 268, 347, 283, 365, 381, 466, 294, 389, 405, 495, 415, 520, 527, 640, 190, 287, 291, 378, 311, 394, 410, 511, 324, 422, 426, 526, 460, 537, 562, 668, 357, 449, 462, 561, 486, 575, 591, 691, 512, 595, 616, 696, 628, 715, 744, 811, 19, 38, 44, 88, 48, 95, 103, 167, 55, 106, 118, 181, 127, 193, 204, 299, 65, 120, 130, 202, 143, 215, 217, 304, 153, 222, 238, 317, 256, 332, 339, 427, 74, 140, 152, 216, 170, 233, 242, 331, 175, 253, 262, 345, 271, 353, 368, 474, 184, 270, 284, 367, 293, 383, 402, 505, 313, 411, 418, 519, 447, 529, 551, 666, 81, 169, 172, 251, 183, 266, 274, 363, 192, 285, 290, 380, 305, 404, 414, 514, 236, 296, 312, 413, 320, 430, 437, 528, 351, 448, 463, 557, 481, 574, 588, 681, 263, 322, 346, 436, 366, 452, 473, 565, 390, 477, 493, 587, 513, 596, 618, 712, 393, 503, 521, 615, 531, 621, 649, 726, 560, 663, 671, 751, 679, 774, 792, 851, 91, 182, 191, 292, 232, 306, 314, 409, 252, 316, 323, 431, 350, 445, 464, 559, 269, 348, 364, 451, 382, 472, 485, 586, 392, 487, 510, 593, 524, 617, 627, 723, 295, 379, 391, 484, 396, 496, 515, 614, 417, 522, 533, 626, 558, 651, 669, 750, 446, 549, 564, 664, 589, 675, 680, 771, 608, 692, 695, 794, 725, 795, 803, 880, 321, 395, 416, 523, 428, 536, 552, 652, 480, 563, 576, 670, 594, 678, 693, 777, 482, 592, 613, 690, 619, 694, 722, 796, 639, 727, 740, 812, 759, 837, 847, 906, 525, 620, 638, 724, 650, 730, 754, 819, 674, 762, 772, 846, 776, 852, 857, 925, 682, 775, 793, 853, 818, 859, 882, 931, 821, 891, 893, 946, 912, 956, 964, 985, 26, 52, 54, 99, 62, 110, 112, 195, 67, 115, 121, 207, 134, 223, 226, 340, 68, 133, 135, 225, 162, 244, 246, 358, 164, 259, 280, 373, 302, 397, 406, 530, 75, 154, 163, 248, 179, 278, 281, 385, 196, 303, 327, 419, 328, 434, 440, 538, 209, 329, 344, 438, 360, 456, 470, 566, 374, 475, 491, 582, 494, 599, 612, 746, 111, 173, 180, 300, 208, 330, 341, 433, 229, 343, 359, 455, 370, 469, 488, 577, 247, 362, 375, 476, 398, 492, 497, 597, 420, 501, 509, 611, 545, 637, 654, 761, 265, 386, 407, 499, 425, 516, 532, 629, 441, 546, 567, 646, 579, 667, 677, 773, 458, 573, 584, 676, 607, 689, 707, 785, 634, 713, 731, 806, 742, 820, 840, 914, 122, 197, 224, 342, 245, 361, 371, 471, 264, 376, 399, 498, 421, 507, 518, 622, 279, 401, 424, 517, 439, 543, 556, 641, 457, 568, 580, 672, 600, 687, 705, 778, 326, 435, 443, 555, 467, 578, 585, 683, 489, 601, 606, 697, 631, 711, 721, 804, 508, 609, 635, 716, 648, 738, 743, 823, 659, 752, 763, 838, 786, 855, 871, 927, 337, 465, 478, 598, 500, 605, 625, 714, 541, 633, 645, 737, 655, 745, 758, 834, 547, 653, 660, 755, 684, 767, 784, 848, 702, 791, 802, 865, 813, 878, 887, 940, 569, 688, 699, 781, 717, 800, 808, 873, 732, 817, 828, 886, 839, 895, 904, 950, 764, 833, 843, 900, 862, 910, 917, 962, 869, 922, 930, 967, 939, 975, 984, 1004, 155, 230, 249, 377, 277, 400, 423, 534, 298, 432, 442, 548, 459, 572, 583, 706, 336, 453, 468, 581, 490, 602, 604, 708, 504, 610, 632, 729, 647, 741, 747, 822, 354, 483, 502, 603, 540, 624, 636, 739, 544, 644, 656, 748, 665, 760, 770, 841, 554, 662, 685, 769, 701, 783, 799, 870, 719, 807, 816, 877, 830, 894, 898, 949, 369, 539, 542, 642, 553, 658, 673, 765, 571, 686, 698, 780, 709, 801, 810, 875, 630, 704, 718, 809, 733, 824, 827, 888, 757, 832, 844, 897, 858, 909, 916, 961, 657, 735, 749, 826, 768, 836, 850, 903, 787, 854, 864, 915, 874, 923, 933, 970, 790, 868, 879, 928, 889, 936, 941, 977, 905, 947, 954, 982, 959, 990, 992, 1012, 387, 550, 570, 700, 623, 710, 720, 805, 643, 728, 736, 825, 756, 829, 845, 902, 661, 753, 766, 835, 782, 849, 861, 913, 789, 863, 872, 920, 884, 932, 938, 973, 703, 779, 788, 860, 798, 867, 876, 926, 815, 881, 890, 937, 901, 943, 951, 981, 842, 896, 908, 948, 918, 957, 960, 988, 929, 966, 969, 994, 976, 997, 999, 1013, 734, 797, 814, 883, 831, 892, 899, 944, 856, 907, 911, 953, 921, 958, 968, 991, 866, 919, 924, 965, 934, 971, 972, 998, 945, 978, 980, 1000, 986, 1005, 1007, 1017, 885, 935, 942, 974, 952, 979, 983, 1002, 955, 987, 989, 1006, 995, 1008, 1010, 1019, 963, 993, 996, 1009, 1001, 1011, 1014, 1020, 1003, 1015, 1016, 1021, 1018, 1022, 1023, 1024].

When N=1024, the sorted sequence is a Q sequence, and is denoted as a sequence (11):

[1, 2, 5, 9, 3, 17, 33, 7, 65, 513, 4, 13, 6, 19, 129, 10, 34, 18, 11, 25, 21, 35, 257, 66, 37, 8, 67, 130, 12, 41, 20, 133, 514, 14, 69, 49, 73, 258, 15, 22, 131, 81, 27, 36, 259, 137, 39, 97, 23, 517, 38, 26, 68, 265, 42, 145, 29, 70, 261, 50, 43, 161, 71, 521, 45, 75, 82, 132, 273, 193, 16, 51, 74, 53, 24, 515, 135, 138, 289, 77, 134, 83, 28, 98, 260, 40, 529, 57, 139, 85, 30, 146, 262, 44, 321, 545, 99, 141, 266, 31, 89, 147, 263, 72, 519, 162, 46, 101, 385, 149, 52, 47, 577, 76, 267, 54, 274, 165, 194, 105, 516, 163, 269, 78, 153, 275, 55, 525, 58, 113, 136, 86, 79, 290, 518, 195, 84, 291, 59, 277, 169, 531, 100, 140, 323, 197, 87, 641, 177, 61, 90, 281, 102, 148, 522, 293, 142, 322, 91, 143, 546, 32, 201, 103, 264, 530, 106, 387, 48, 297, 523, 209, 154, 93, 150, 268, 164, 537, 769, 533, 325, 151, 56, 166, 107, 305, 114, 578, 276, 549, 270, 386, 155, 80, 109, 225, 167, 60, 579, 170, 115, 196, 329, 271, 278, 157, 547, 88, 117, 389, 520, 337, 292, 279, 198, 642, 62, 178, 171, 553, 92, 282, 199, 63, 524, 144, 173, 295, 585, 202, 393, 104, 645, 121, 294, 283, 532, 353, 179, 203, 561, 324, 298, 94, 581, 152, 210, 181, 526, 285, 108, 401, 770, 95, 205, 299, 527, 327, 156, 534, 306, 110, 326, 643, 211, 116, 185, 539, 168, 301, 593, 226, 388, 330, 548, 111, 417, 771, 158, 272, 213, 551, 307, 118, 649, 172, 227, 331, 609, 338, 390, 535, 309, 217, 550, 159, 391, 538, 119, 280, 333, 580, 174, 122, 777, 339, 200, 554, 180, 657, 354, 284, 541, 313, 449, 582, 229, 394, 773, 123, 175, 673, 555, 785, 204, 562, 395, 182, 341, 583, 557, 64, 296, 286, 233, 125, 183, 206, 287, 300, 355, 212, 402, 186, 397, 587, 345, 594, 647, 528, 96, 563, 241, 644, 207, 705, 328, 586, 403, 536, 214, 357, 308, 419, 565, 801, 589, 187, 302, 646, 112, 569, 303, 595, 361, 228, 650, 772, 418, 540, 215, 405, 310, 189, 450, 332, 218, 610, 597, 552, 651, 160, 230, 120, 334, 409, 311, 421, 219, 542, 369, 658, 231, 774, 392, 176, 556, 314, 833, 340, 221, 611, 653, 335, 451, 778, 124, 543, 342, 601, 425, 234, 659, 235, 775, 315, 613, 126, 674, 356, 184, 584, 288, 558, 396, 564, 661, 242, 779, 559, 317, 346, 617, 675, 897, 404, 343, 398, 188, 453, 208, 433, 786, 237, 588, 566, 665, 781, 347, 362, 127, 243, 358, 706, 406, 677, 590, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 410, 652, 370, 835, 411, 709, 232, 614, 316, 573, 365, 660, 423, 336, 222, 689, 452, 793, 371, 612, 426, 602, 236, 805, 413, 654, 481, 834, 223, 713, 344, 603, 318, 544, 454, 655, 427, 615, 373, 776, 434, 560, 238, 899, 618, 348, 809, 244, 721, 455, 666, 319, 605, 377, 662, 429, 780, 239, 676, 360, 837, 400, 626, 246, 663, 678, 435, 568, 458, 817, 350, 619, 459, 788, 466, 782, 898, 364, 667, 408, 592, 128, 621, 437, 737, 351, 679, 572, 247, 682, 250, 627, 461, 708, 841, 412, 783, 366, 790, 441, 600, 424, 669, 629, 467, 901, 251, 849, 804, 372, 791, 192, 710, 482, 574, 690, 414, 683, 367, 604, 794, 469, 714, 374, 711, 253, 575, 656, 483, 807, 415, 685, 905, 375, 616, 224, 633, 806, 428, 795, 865, 430, 691, 473, 715, 836, 456, 810, 378, 606, 620, 436, 664, 722, 485, 797, 320, 693, 913, 431, 607, 717, 240, 811, 379, 839, 668, 438, 818, 622, 460, 838, 723, 248, 697, 381, 738, 680, 462, 813, 628, 489, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 826, 501, 688, 446, 933, 847, 636, 963, 733, 937, 476, 854, 827, 447, 746, 868, 638, 908, 800, 488, 696, 747, 829, 858, 754, 855, 916, 965, 478, 910, 720, 505, 749, 945, 639, 755, 870, 256, 911, 700, 859, 479, 918, 871, 728, 494, 874, 969, 932, 702, 816, 861, 500, 757, 492, 875, 732, 923, 824, 977, 919, 934, 744, 761, 882, 495, 703, 922, 877, 935, 828, 848, 734, 503, 883, 938, 384, 964, 748, 506, 856, 925, 993, 735, 502, 830, 966, 939, 885, 946, 750, 860, 756, 480, 967, 831, 889, 941, 751, 872, 507, 971, 912, 758, 947, 970, 862, 978, 448, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024].

When N=1024, the sorted sequence is a Z sequence, and is denoted as a sequence (12):

[1, 2, 5, 11, 3, 13, 8, 26, 4, 16, 19, 29, 12, 34, 39, 71, 6, 18, 14, 31, 21, 40, 49, 75, 20, 52, 43, 83, 57, 91, 100, 162, 7, 17, 22, 44, 25, 51, 47, 86, 30, 55, 61, 94, 65, 107, 112, 169, 36, 60, 72, 111, 74, 116, 127, 183, 88, 129, 139, 198, 150, 217, 224, 332, 9, 24, 27, 53, 35, 58, 63, 104, 37, 73, 66, 114, 80, 124, 133, 194, 42, 67, 82, 137, 90, 132, 147, 208, 101, 151, 159, 221, 174, 244, 254, 351, 48, 84, 97, 143, 108, 153, 164, 232, 120, 167, 185, 251, 195, 262, 276, 371, 130, 187, 201, 266, 209, 284, 299, 394, 234, 304, 320, 417, 336, 428, 461, 581, 15, 28, 41, 68, 32, 81, 77, 131, 46, 78, 89, 144, 98, 157, 160, 226, 56, 92, 102, 154, 110, 175, 182, 246, 125, 173, 193, 259, 206, 279, 296, 392, 62, 106, 122, 177, 118, 184, 197, 269, 141, 200, 219, 286, 227, 303, 321, 406, 149, 218, 239, 309, 248, 328, 337, 431, 267, 344, 368, 449, 384, 482, 498, 611, 70, 119, 136, 202, 146, 215, 223, 307, 163, 230, 240, 325, 255, 338, 355, 451, 172, 247, 265, 342, 281, 361, 381, 468, 294, 387, 399, 484, 411, 514, 528, 635, 196, 272, 287, 376, 317, 393, 403, 506, 335, 422, 424, 522, 454, 542, 557, 662, 353, 438, 462, 547, 480, 563, 588, 673, 496, 590, 606, 698, 625, 727, 757, 841, 23, 38, 45, 85, 59, 93, 103, 165, 54, 99, 115, 176, 123, 191, 204, 280, 69, 117, 126, 189, 140, 205, 214, 300, 152, 222, 236, 312, 250, 334, 339, 433, 79, 134, 138, 213, 156, 235, 228, 333, 170, 243, 256, 340, 270, 369, 373, 471, 186, 261, 283, 363, 293, 383, 397, 486, 314, 408, 426, 508, 441, 532, 551, 656, 95, 158, 145, 242, 181, 263, 258, 357, 203, 274, 288, 386, 301, 395, 414, 513, 212, 290, 306, 410, 329, 419, 447, 530, 347, 442, 459, 545, 479, 570, 585, 687, 238, 311, 341, 430, 362, 463, 473, 559, 375, 460, 488, 577, 510, 597, 618, 708, 401, 502, 518, 609, 538, 623, 633, 740, 553, 648, 664, 720, 675, 772, 791, 880, 109, 192, 168, 273, 210, 291, 297, 405, 231, 318, 327, 435, 345, 448, 469, 561, 252, 343, 359, 446, 382, 465, 492, 579, 396, 500, 504, 595, 524, 616, 630, 723, 277, 379, 364, 475, 398, 494, 512, 601, 421, 520, 536, 638, 555, 641, 659, 747, 452, 540, 566, 651, 583, 667, 693, 765, 599, 684, 711, 802, 730, 807, 817, 912, 315, 385, 415, 516, 450, 534, 549, 646, 477, 568, 572, 670, 592, 678, 695, 783, 490, 574, 604, 705, 621, 690, 737, 795, 643, 743, 714, 814, 761, 832, 845, 897, 526, 613, 628, 717, 654, 733, 750, 823, 681, 754, 787, 858, 769, 849, 869, 938, 701, 799, 776, 856, 805, 888, 877, 929, 835, 883, 904, 949, 920, 961, 975, 993, 10, 33, 76, 121, 50, 135, 105, 211, 64, 155, 171, 225, 128, 249, 257, 350, 87, 166, 142, 237, 180, 260, 292, 360, 178, 298, 268, 380, 313, 400, 418, 533, 96, 161, 207, 275, 190, 295, 282, 390, 220, 308, 323, 407, 331, 434, 440, 541, 241, 326, 352, 436, 365, 456, 470, 567, 372, 481, 499, 587, 509, 614, 626, 738, 113, 188, 199, 302, 245, 316, 330, 432, 229, 358, 346, 455, 367, 467, 483, 580, 271, 348, 374, 489, 389, 472, 497, 600, 420, 521, 531, 619, 552, 649, 660, 759, 289, 388, 412, 519, 427, 507, 537, 634, 443, 544, 571, 650, 582, 669, 685, 774, 476, 562, 591, 680, 603, 691, 713, 788, 636, 706, 729, 810, 745, 820, 838, 915, 148, 216, 264, 354, 233, 370, 349, 485, 285, 377, 391, 501, 413, 525, 535, 627, 310, 402, 423, 511, 437, 554, 564, 652, 457, 550, 578, 666, 602, 694, 709, 780, 322, 429, 444, 558, 466, 565, 586, 677, 493, 589, 617, 697, 631, 715, 735, 806, 515, 615, 642, 718, 657, 731, 748, 824, 674, 762, 771, 843, 790, 853, 870, 931, 356, 464, 487, 593, 505, 612, 624, 719, 529, 622, 644, 739, 661, 758, 770, 834, 548, 653, 672, 752, 688, 763, 784, 848, 704, 789, 798, 860, 812, 876, 887, 942, 584, 676, 696, 778, 726, 792, 801, 866, 732, 818, 825, 882, 836, 894, 902, 951, 751, 828, 839, 896, 857, 907, 916, 956, 867, 919, 928, 966, 937, 976, 985, 1008, 179, 253, 278, 378, 319, 404, 425, 539, 305, 416, 439, 556, 458, 575, 596, 689, 324, 453, 478, 573, 495, 598, 610, 710, 517, 620, 639, 722, 655, 746, 753, 822, 366, 474, 491, 608, 523, 637, 629, 734, 546, 647, 663, 749, 679, 773, 775, 854, 569, 668, 692, 766, 703, 782, 796, 862, 724, 804, 816, 874, 826, 889, 899, 948, 409, 527, 503, 645, 560, 671, 665, 767, 594, 683, 699, 786, 712, 793, 809, 875, 607, 700, 716, 797, 744, 815, 829, 884, 755, 827, 844, 895, 855, 910, 918, 962, 640, 721, 741, 819, 768, 840, 847, 903, 777, 850, 859, 913, 872, 923, 934, 969, 800, 868, 878, 930, 892, 940, 925, 980, 900, 946, 954, 973, 957, 989, 995, 1013, 445, 576, 543, 682, 605, 702, 707, 803, 632, 728, 736, 821, 756, 833, 842, 906, 658, 742, 764, 830, 781, 846, 864, 914, 794, 871, 861, 922, 885, 933, 939, 974, 686, 779, 760, 852, 808, 865, 873, 926, 813, 879, 891, 943, 901, 936, 950, 982, 837, 893, 908, 947, 917, 955, 964, 987, 924, 960, 970, 998, 977, 991, 1001, 1017, 725, 785, 811, 881, 831, 890, 898, 945, 851, 909, 905, 958, 921, 952, 965, 992, 863, 911, 927, 968, 935, 963, 979, 996, 944, 981, 971, 999, 986, 1004, 1006, 1015, 886, 932, 941, 972, 953, 978, 983, 1002, 959, 984, 994, 1009, 988, 1003, 1011, 1020, 967, 997, 990, 1007, 1000, 1014, 1010, 1019, 1005, 1012, 1016, 1021, 1018, 1022, 1023, 1024].

When N=1024, the sorted sequence is a Q sequence, and is denoted as a sequence (13):

[1, 2, 5, 9, 3, 17, 33, 7, 65, 513, 4, 13, 6, 19, 129, 10, 34, 18, 11, 25, 21, 35, 257, 66, 37, 8, 67, 130, 12, 41, 20, 133, 514, 14, 69, 49, 73, 258, 15, 22, 131, 81, 27, 36, 259, 137, 39, 97, 23, 517, 38, 26, 68, 265, 42, 145, 29, 70, 261, 50, 75, 161, 43, 521, 71, 45, 82, 132, 273, 193, 16, 51, 74, 24, 53, 515, 135, 138, 289, 77, 134, 83, 28, 98, 260, 40, 529, 57, 139, 85, 30, 146, 262, 44, 321, 545, 99, 141, 266, 31, 89, 147, 263, 72, 519, 162, 46, 101, 385, 149, 52, 47, 577, 76, 267, 54, 274, 165, 194, 105, 516, 163, 269, 78, 153, 275, 55, 525, 58, 113, 136, 86, 79, 290, 518, 195, 84, 291, 59, 277, 169, 531, 100, 140, 323, 197, 87, 641, 177, 61, 90, 281, 102, 148, 522, 293, 142, 322, 143, 91, 546, 201, 32, 103, 264, 530, 106, 387, 48, 297, 523, 209, 154, 93, 150, 268, 164, 537, 769, 533, 325, 151, 114, 166, 107, 305, 56, 578, 276, 549, 270, 386, 155, 80, 225, 167, 109, 60, 579, 170, 115, 196, 329, 271, 278, 157, 547, 88, 117, 389, 520, 337, 292, 279, 198, 642, 62, 178, 171, 553, 199, 282, 144, 63, 524, 92, 173, 295, 585, 202, 393, 104, 645, 121, 294, 283, 532, 353, 179, 203, 561, 324, 298, 94, 581, 152, 210, 181, 526, 285, 108, 401, 770, 95, 205, 299, 527, 327, 156, 534, 306, 110, 326, 643, 211, 116, 185, 539, 168, 301, 593, 226, 388, 330, 548, 111, 417, 771, 158, 272, 213, 551, 307, 118, 649, 172, 227, 331, 609, 338, 390, 535, 309, 217, 550, 159, 391, 538, 119, 280, 333, 580, 174, 122, 777, 339, 200, 554, 180, 657, 354, 284, 541, 313, 449, 582, 229, 394, 773, 123, 175, 673, 555, 785, 204, 562, 395, 182, 341, 583, 557, 64, 296, 286, 233, 125, 183, 206, 287, 300, 355, 212, 402, 186, 397, 587, 345, 594, 647, 528, 96, 563, 241, 644, 207, 705, 328, 586, 403, 536, 214, 357, 308, 419, 565, 801, 589, 187, 302, 646, 112, 569, 303, 595, 361, 228, 650, 772, 418, 540, 215, 405, 310, 189, 450, 332, 218, 610, 597, 552, 651, 160, 230, 120, 334, 409, 311, 421, 219, 542, 369, 658, 231, 774, 392, 176, 556, 314, 833, 340, 221, 611, 653, 335, 451, 778, 124, 543, 342, 601, 425, 315, 659, 234, 775, 184, 613, 126, 674, 356, 235, 584, 396, 558, 242, 564, 661, 317, 779, 559, 343, 346, 617, 675, 897, 404, 288, 398, 188, 453, 208, 433, 786, 237, 588, 566, 665, 781, 347, 362, 127, 243, 358, 706, 406, 677, 590, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 410, 652, 370, 835, 411, 709, 232, 614, 316, 573, 365, 660, 423, 336, 222, 689, 452, 793, 371, 612, 426, 602, 236, 805, 413, 654, 481, 834, 223, 713, 344, 603, 318, 544, 454, 655, 427, 615, 373, 776, 434, 560, 238, 899, 618, 348, 809, 244, 721, 455, 666, 319, 605, 377, 662, 429, 780, 239, 676, 360, 837, 400, 626, 246, 663, 678, 435, 568, 458, 817, 350, 619, 459, 788, 466, 782, 898, 364, 667, 408, 592, 128, 621, 437, 737, 247, 679, 572, 250, 682, 351, 627, 461, 708, 841, 412, 783, 366, 790, 441, 600, 424, 669, 629, 467, 901, 251, 849, 804, 372, 791, 192, 710, 482, 574, 690, 414, 683, 367, 604, 794, 469, 714, 374, 711, 253, 575, 656, 415, 807, 483, 685, 905, 375, 616, 224, 633, 806, 428, 795, 865, 430, 691, 473, 715, 836, 456, 810, 378, 606, 620, 436, 664, 722, 320, 797, 431, 693, 913, 240, 607, 717, 485, 811, 379, 839, 668, 438, 818, 622, 460, 838, 723, 462, 697, 248, 738, 680, 381, 813, 628, 489, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 826, 501, 688, 446, 636, 933, 847, 963, 733, 937, 476, 854, 827, 447, 746, 868, 638, 908, 488, 696, 747, 829, 858, 754, 855, 916, 965, 478, 910, 720, 505, 749, 945, 800, 639, 870, 911, 256, 755, 700, 859, 479, 918, 871, 728, 494, 874, 932, 969, 702, 816, 861, 500, 757, 492, 732, 923, 824, 875, 977, 919, 934, 744, 761, 882, 495, 703, 922, 877, 935, 828, 848, 734, 503, 883, 938, 384, 964, 748, 506, 856, 925, 993, 735, 502, 830, 966, 939, 885, 946, 750, 860, 756, 480, 967, 831, 889, 941, 751, 872, 507, 971, 912, 758, 947, 970, 862, 978, 448, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024].

When N=1024, the sorted sequence is a Z sequence, and is denoted as a sequence (14):

[1, 2, 5, 11, 3, 13, 8, 26, 4, 16, 19, 29, 12, 34, 39, 71, 6, 18, 14, 31, 21, 40, 49, 74, 20, 52, 43, 83, 57, 91, 100, 163, 7, 17, 22, 44, 25, 51, 47, 86, 30, 55, 63, 94, 66, 107, 112, 169, 36, 60, 72, 111, 75, 116, 127, 187, 88, 129, 139, 198, 150, 217, 224, 332, 9, 24, 27, 53, 35, 58, 65, 104, 37, 73, 61, 114, 80, 124, 133, 194, 42, 67, 82, 137, 90, 132, 147, 208, 101, 151, 160, 226, 174, 244, 254, 351, 48, 84, 97, 143, 108, 153, 164, 232, 120, 167, 185, 251, 197, 262, 276, 371, 130, 183, 201, 266, 209, 284, 299, 394, 234, 304, 320, 417, 336, 428, 461, 581, 15, 28, 41, 68, 32, 81, 77, 131, 46, 78, 89, 144, 98, 157, 159, 223, 56, 92, 102, 154, 110, 175, 182, 246, 125, 173, 193, 259, 206, 279, 296, 392, 62, 106, 122, 177, 118, 184, 196, 269, 141, 200, 219, 286, 227, 303, 321, 406, 149, 218, 239, 309, 248, 328, 337, 426, 267, 344, 368, 449, 384, 482, 498, 611, 70, 119, 136, 202, 146, 215, 221, 307, 162, 230, 240, 325, 255, 338, 355, 451, 172, 247, 265, 342, 281, 361, 381, 468, 294, 387, 399, 484, 411, 514, 528, 635, 195, 272, 287, 376, 317, 393, 403, 506, 335, 424, 431, 522, 454, 542, 557, 659, 353, 435, 462, 547, 480, 563, 585, 675, 496, 588, 606, 698, 625, 727, 757, 841, 23, 38, 45, 85, 59, 93, 103, 165, 54, 99, 115, 176, 123, 191, 204, 280, 69, 117, 126, 189, 140, 205, 214, 300, 152, 222, 236, 312, 250, 334, 339, 447, 79, 134, 138, 213, 156, 235, 228, 333, 170, 243, 256, 340, 270, 369, 373, 471, 186, 261, 283, 363, 293, 383, 397, 486, 314, 408, 422, 508, 438, 532, 551, 654, 95, 158, 145, 242, 181, 263, 258, 357, 203, 274, 288, 386, 301, 395, 414, 513, 212, 290, 306, 410, 329, 419, 441, 530, 347, 442, 459, 545, 479, 570, 590, 687, 238, 311, 341, 430, 362, 463, 473, 559, 375, 460, 488, 577, 510, 597, 618, 708, 401, 502, 518, 609, 538, 623, 633, 740, 553, 648, 664, 720, 678, 772, 791, 880, 109, 192, 168, 273, 210, 291, 297, 405, 231, 318, 327, 433, 345, 448, 469, 561, 252, 343, 359, 446, 382, 465, 492, 579, 396, 500, 504, 595, 524, 616, 628, 723, 277, 379, 364, 475, 398, 494, 512, 601, 421, 520, 536, 638, 555, 641, 656, 747, 452, 540, 566, 651, 583, 667, 693, 765, 599, 684, 711, 802, 730, 807, 817, 912, 315, 385, 415, 516, 450, 534, 549, 646, 477, 568, 572, 670, 592, 673, 695, 783, 490, 574, 604, 705, 621, 690, 737, 795, 643, 743, 714, 814, 761, 831, 845, 897, 526, 613, 630, 717, 662, 733, 750, 822, 681, 754, 787, 858, 769, 849, 869, 938, 701, 799, 776, 856, 805, 888, 877, 929, 834, 883, 904, 949, 920, 961, 975, 993, 10, 33, 76, 121, 50, 135, 105, 211, 64, 155, 171, 225, 128, 249, 257, 350, 87, 166, 142, 237, 180, 260, 292, 360, 178, 298, 268, 380, 313, 400, 418, 533, 96, 161, 207, 275, 190, 295, 282, 390, 220, 308, 323, 407, 331, 434, 440, 541, 241, 326, 352, 436, 365, 456, 470, 567, 372, 481, 499, 587, 509, 614, 626, 738, 113, 188, 199, 302, 245, 316, 330, 432, 229, 358, 346, 455, 367, 467, 483, 580, 271, 348, 374, 489, 389, 472, 497, 600, 420, 521, 531, 619, 552, 649, 660, 759, 289, 388, 412, 519, 427, 507, 537, 634, 443, 544, 571, 650, 582, 669, 685, 774, 476, 562, 591, 680, 603, 691, 713, 788, 636, 706, 729, 808, 745, 820, 838, 915, 148, 216, 264, 354, 233, 370, 349, 485, 285, 377, 391, 501, 413, 525, 535, 627, 310, 402, 423, 511, 437, 554, 564, 652, 457, 550, 578, 666, 602, 694, 709, 780, 322, 429, 444, 558, 466, 565, 586, 677, 493, 589, 617, 697, 631, 715, 735, 806, 515, 615, 642, 718, 657, 731, 748, 823, 674, 762, 771, 843, 790, 853, 870, 931, 356, 464, 487, 593, 505, 612, 624, 719, 529, 622, 644, 739, 661, 758, 770, 833, 548, 653, 672, 752, 688, 763, 784, 848, 704, 789, 798, 859, 812, 876, 887, 942, 584, 676, 696, 778, 726, 792, 801, 866, 732, 818, 824, 882, 835, 894, 902, 951, 751, 827, 842, 896, 857, 907, 916, 956, 867, 919, 928, 966, 937, 976, 985, 1008, 179, 253, 278, 378, 319, 404, 425, 539, 305, 416, 439, 556, 458, 575, 596, 689, 324, 453, 478, 573, 495, 598, 610, 710, 517, 620, 639, 722, 655, 746, 753, 837, 366, 474, 491, 608, 523, 637, 629, 734, 546, 647, 663, 749, 679, 773, 775, 854, 569, 668, 692, 766, 703, 782, 796, 861, 724, 804, 816, 874, 825, 889, 899, 948, 409, 527, 503, 645, 560, 671, 665, 767, 594, 683, 699, 786, 712, 793, 810, 875, 607, 700, 716, 797, 744, 815, 828, 884, 755, 826, 844, 895, 855, 910, 918, 962, 640, 721, 741, 819, 768, 839, 847, 903, 777, 850, 862, 913, 872, 923, 934, 969, 800, 868, 878, 930, 892, 940, 925, 980, 900, 946, 954, 973, 957, 989, 995, 1013, 445, 576, 543, 682, 605, 702, 707, 803, 632, 728, 736, 821, 756, 832, 840, 906, 658, 742, 764, 829, 781, 846, 864, 914, 794, 871, 860, 922, 885, 933, 939, 974, 686, 779, 760, 851, 809, 865, 873, 926, 813, 879, 891, 943, 901, 936, 950, 982, 836, 893, 908, 947, 917, 955, 964, 987, 924, 960, 970, 998, 977, 991, 1001, 1017, 725, 785, 811, 881, 830, 890, 898, 945, 852, 909, 905, 958, 921, 952, 965, 992, 863, 911, 927, 968, 935, 963, 979, 996, 944, 981, 971, 999, 986, 1004, 1006, 1015, 886, 932, 941, 972, 953, 978, 983, 1002, 959, 984, 994, 1009, 988, 1003, 1011, 1020, 967, 997, 990, 1007, 1000, 1014, 1010, 1019, 1005, 1012, 1016, 1021, 1018, 1022, 1023, 1024].

When N=1024, the sorted sequence is a Q sequence, and is denoted as a sequence (15):

[1, 2, 5, 9, 3, 17, 33, 7, 65, 513, 4, 13, 6, 19, 129, 10, 34, 18, 11, 25, 21, 35, 257, 66, 37, 8, 67, 130, 12, 41, 20, 133, 514, 14, 69, 49, 73, 258, 15, 22, 131, 81, 27, 36, 259, 137, 39, 97, 23, 517, 38, 26, 68, 265, 42, 145, 29, 70, 261, 50, 43, 161, 71, 521, 45, 75, 82, 132, 273, 193, 16, 51, 74, 53, 24, 515, 135, 138, 289, 77, 134, 83, 28, 98, 260, 40, 529, 57, 139, 85, 30, 146, 262, 44, 321, 545, 99, 141, 266, 31, 89, 147, 263, 72, 519, 162, 46, 101, 385, 149, 52, 47, 577, 76, 267, 54, 274, 165, 194, 105, 516, 163, 269, 78, 153, 275, 55, 525, 58, 113, 136, 86, 79, 290, 518, 195, 84, 291, 59, 277, 169, 531, 100, 140, 323, 197, 87, 641, 177, 61, 90, 281, 102, 148, 522, 293, 142, 322, 91, 143, 546, 32, 201, 103, 264, 530, 106, 387, 48, 297, 523, 209, 154, 93, 150, 268, 164, 537, 769, 533, 325, 151, 56, 166, 107, 305, 114, 578, 276, 549, 270, 386, 155, 80, 109, 225, 167, 60, 579, 170, 115, 196, 329, 271, 278, 157, 547, 88, 117, 389, 520, 337, 292, 279, 198, 642, 62, 178, 171, 553, 92, 282, 199, 63, 524, 144, 173, 295, 585, 202, 393, 104, 645, 121, 294, 283, 532, 353, 179, 203, 561, 324, 298, 94, 581, 152, 210, 181, 526, 285, 108, 401, 770, 95, 205, 299, 527, 327, 156, 534, 306, 110, 326, 643, 211, 116, 185, 539, 168, 301, 593, 226, 388, 330, 548, 111, 417, 771, 158, 272, 213, 551, 307, 118, 649, 172, 227, 331, 609, 338, 390, 535, 309, 217, 550, 159, 391, 538, 119, 280, 333, 580, 174, 122, 777, 339, 200, 554, 180, 657, 354, 284, 541, 313, 449, 582, 229, 394, 773, 123, 175, 673, 555, 785, 204, 562, 395, 182, 341, 583, 557, 64, 296, 286, 233, 125, 183, 206, 287, 300, 355, 212, 402, 186, 397, 587, 345, 594, 647, 528, 96, 563, 241, 644, 207, 705, 328, 586, 403, 536, 214, 357, 308, 419, 565, 801, 589, 187, 302, 646, 112, 569, 303, 595, 361, 228, 650, 772, 418, 540, 215, 405, 310, 189, 450, 332, 218, 610, 597, 552, 651, 160, 230, 120, 334, 409, 311, 421, 219, 542, 369, 658, 231, 774, 392, 176, 556, 314, 833, 340, 221, 611, 653, 335, 451, 778, 124, 543, 342, 601, 425, 234, 659, 235, 775, 315, 613, 126, 674, 356, 184, 584, 288, 558, 396, 564, 661, 242, 779, 559, 317, 346, 617, 675, 897, 404, 343, 398, 188, 453, 208, 433, 786, 237, 588, 566, 665, 781, 347, 362, 127, 243, 358, 706, 406, 677, 590, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 410, 652, 370, 835, 411, 709, 232, 614, 316, 573, 365, 660, 423, 336, 222, 689, 452, 793, 371, 612, 426, 602, 236, 805, 413, 654, 481, 834, 223, 713, 344, 603, 318, 544, 454, 655, 427, 615, 373, 776, 434, 560, 238, 899, 618, 348, 809, 244, 721, 455, 666, 319, 605, 377, 662, 429, 780, 239, 676, 360, 837, 400, 626, 246, 663, 678, 435, 568, 458, 817, 350, 619, 459, 788, 466, 782, 898, 364, 667, 408, 592, 128, 621, 437, 737, 351, 679, 572, 247, 682, 250, 627, 461, 708, 841, 412, 783, 366, 790, 441, 600, 424, 669, 629, 467, 901, 251, 849, 804, 372, 791, 192, 710, 482, 574, 690, 414, 683, 367, 604, 794, 469, 714, 374, 711, 253, 575, 656, 483, 807, 415, 685, 905, 375, 616, 224, 633, 806, 428, 795, 865, 430, 691, 473, 715, 836, 456, 810, 378, 606, 620, 436, 664, 722, 485, 797, 320, 693, 913, 431, 607, 717, 240, 811, 379, 839, 668, 438, 818, 622, 460, 838, 723, 248, 697, 381, 738, 680, 462, 813, 628, 489, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 826, 501, 688, 446, 933, 847, 636, 963, 733, 937, 476, 854, 827, 447, 746, 868, 638, 908, 800, 488, 696, 747, 829, 858, 754, 855, 916, 965, 478, 910, 720, 505, 749, 945, 639, 755, 870, 256, 911, 700, 859, 479, 918, 871, 728, 494, 874, 969, 932, 702, 816, 861, 500, 757, 492, 875, 732, 923, 824, 977, 919, 934, 744, 761, 882, 495, 703, 922, 877, 935, 828, 848, 734, 503, 883, 938, 384, 964, 748, 506, 856, 925, 993, 735, 502, 830, 966, 939, 885, 946, 750, 860, 756, 480, 967, 831, 889, 941, 751, 872, 507, 971, 912, 758, 947, 970, 862, 978, 448, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024].

When N=1024, the sorted sequence is a Z sequence, and is denoted as a sequence (16):

[1, 2, 5, 11, 3, 13, 8, 26, 4, 16, 19, 29, 12, 34, 39, 71, 6, 18, 14, 31, 21, 40, 49, 75, 20, 52, 43, 83, 57, 91, 100, 162, 7, 17, 22, 44, 25, 51, 47, 86, 30, 55, 61, 94, 65, 107, 112, 169, 36, 60, 72, 111, 74, 116, 127, 183, 88, 129, 139, 198, 150, 217, 224, 332, 9, 24, 27, 53, 35, 58, 63, 104, 37, 73, 66, 114, 80, 124, 133, 194, 42, 67, 82, 137, 90, 132, 147, 208, 101, 151, 159, 221, 174, 244, 254, 351, 48, 84, 97, 143, 108, 153, 164, 232, 120, 167, 185, 251, 195, 262, 276, 371, 130, 187, 201, 266, 209, 284, 299, 394, 234, 304, 320, 417, 336, 428, 461, 581, 15, 28, 41, 68, 32, 81, 77, 131, 46, 78, 89, 144, 98, 157, 160, 226, 56, 92, 102, 154, 110, 175, 182, 246, 125, 173, 193, 259, 206, 279, 296, 392, 62, 106, 122, 177, 118, 184, 197, 269, 141, 200, 219, 286, 227, 303, 321, 406, 149, 218, 239, 309, 248, 328, 337, 431, 267, 344, 368, 449, 384, 482, 498, 611, 70, 119, 136, 202, 146, 215, 223, 307, 163, 230, 240, 325, 255, 338, 355, 451, 172, 247, 265, 342, 281, 361, 381, 468, 294, 387, 399, 484, 411, 514, 528, 635, 196, 272, 287, 376, 317, 393, 403, 506, 335, 422, 424, 522, 454, 542, 557, 662, 353, 438, 462, 547, 480, 563, 588, 673, 496, 590, 606, 698, 625, 727, 757, 841, 23, 38, 45, 85, 59, 93, 103, 165, 54, 99, 115, 176, 123, 191, 204, 280, 69, 117, 126, 189, 140, 205, 214, 300, 152, 222, 236, 312, 250, 334, 339, 433, 79, 134, 138, 213, 156, 235, 228, 333, 170, 243, 256, 340, 270, 369, 373, 471, 186, 261, 283, 293, 383, 397, 486, 314, 408, 426, 508, 441, 532, 551, 656, 95, 158, 145, 242, 181, 263, 258, 357, 203, 274, 288, 386, 301, 395, 414, 513, 212, 290, 306, 410, 329, 419, 447, 530, 347, 442, 459, 545, 479, 570, 585, 687, 238, 311, 341, 430, 362, 463, 473, 559, 375, 460, 488, 577, 510, 597, 618, 708, 401, 502, 518, 609, 538, 623, 633, 740, 553, 648, 664, 720, 675, 772, 791, 880, 109, 192, 168, 273, 210, 291, 297, 405, 231, 318, 327, 435, 345, 448, 469, 561, 252, 343, 359, 446, 382, 465, 492, 579, 396, 500, 504, 595, 524, 616, 630, 723, 277, 379, 364, 475, 398, 494, 512, 601, 421, 520, 536, 638, 555, 641, 659, 747, 452, 540, 566, 651, 583, 667, 693, 765, 599, 684, 711, 802, 730, 807, 817, 912, 315, 385, 415, 516, 450, 534, 549, 646, 477, 568, 572, 670, 592, 678, 695, 783, 490, 574, 604, 705, 621, 690, 737, 795, 643, 743, 714, 814, 761, 832, 845, 897, 526, 613, 628, 717, 654, 733, 750, 823, 681, 754, 787, 858, 769, 849, 869, 938, 701, 799, 776, 856, 805, 888, 877, 929, 835, 883, 904, 949, 920, 961, 975, 993, 10, 33, 76, 121, 50, 135, 105, 211, 64, 155, 171, 225, 128, 249, 257, 350, 87, 166, 142, 237, 180, 260, 292, 360, 178, 298, 268, 380, 313, 400, 418, 533, 96, 161, 207, 275, 190, 295, 282, 390, 220, 308, 323, 407, 331, 434, 440, 541, 241, 326, 352, 436, 365, 456, 470, 567, 372, 481, 499, 587, 509, 614, 626, 738, 113, 188, 199, 302, 245, 316, 330, 432, 229, 358, 346, 455, 367, 467, 483, 580, 271, 348, 374, 489, 389, 472, 497, 600, 420, 521, 531, 619, 552, 649, 660, 759, 289, 388, 412, 519, 427, 507, 537, 634, 443, 544, 571, 650, 582, 669, 685, 774, 476, 562, 591, 680, 603, 691, 713, 788, 636, 706, 729, 810, 745, 820, 838, 915, 148, 216, 264, 354, 233, 370, 349, 485, 285, 377, 391, 501, 413, 525, 535, 627, 310, 402, 423, 511, 437, 554, 564, 652, 457, 550, 578, 666, 602, 694, 709, 780, 322, 429, 444, 558, 466, 565, 586, 677, 493, 589, 617, 697, 631, 715, 735, 806, 515, 615, 642, 718, 657, 731, 748, 824, 674, 762, 771, 843, 790, 853, 870, 931, 356, 464, 487, 593, 505, 612, 624, 719, 529, 622, 644, 739, 661, 758, 770, 834, 548, 653, 672, 752, 688, 763, 784, 848, 704, 789, 798, 860, 812, 876, 887, 942, 584, 676, 696, 778, 726, 792, 801, 866, 732, 818, 825, 882, 836, 894, 902, 951, 751, 828, 839, 896, 857, 907, 916, 956, 867, 919, 928, 966, 937, 976, 985, 1008, 179, 253, 278, 378, 319, 404, 425, 539, 305, 416, 439, 556, 458, 575, 596, 689, 324, 453, 478, 573, 495, 598, 610, 710, 517, 620, 639, 722, 655, 746, 753, 822, 366, 474, 491, 608, 523, 637, 629, 734, 546, 647, 663, 749, 679, 773, 775, 854, 569, 668, 692, 766, 703, 782, 796, 862, 724, 804, 816, 874, 826, 889, 899, 948, 409, 527, 503, 645, 560, 671, 665, 767, 594, 683, 699, 786, 712, 793, 809, 875, 607, 700, 716, 797, 744, 815, 829, 884, 755, 827, 844, 895, 855, 910, 918, 962, 640, 721, 741, 819, 768, 840, 847, 903, 777, 850, 859, 913, 872, 923, 934, 969, 800, 868, 878, 930, 892, 940, 925, 980, 900, 946, 954, 973, 957, 989, 995, 1013, 445, 576, 543, 682, 605, 702, 707, 803, 632, 728, 736, 821, 756, 833, 842, 906, 658, 742, 764, 830, 781, 846, 864, 914, 794, 871, 861, 922, 885, 933, 939, 974, 686, 779, 760, 852, 808, 865, 873, 926, 813, 879, 891, 943, 901, 936, 950, 982, 837, 893, 908, 947, 917, 955, 964, 987, 924, 960, 970, 998, 977, 991, 1001, 1017, 725, 785, 811, 881, 831, 890, 898, 945, 851, 909, 905, 958, 921, 952, 965, 992, 863, 911, 927, 968, 935, 963, 979, 996, 944, 981, 971, 999, 986, 1004, 1006, 1015, 886, 932, 941, 972, 953, 978, 983, 1002, 959, 984, 994, 1009, 988, 1003, 1011, 1020, 967, 997, 990, 1007, 1000, 1014, 1010, 1019, 1005, 1012, 1016, 1021, 1018, 1022, 1023, 1024].

It should be noted that the foregoing sorted sequences are merely examples, and application of the sequences to a polar encoding process helps improve encoding/decoding performance of a polar code. For any exemplified sorted sequence, on a premise of not affecting an overall effect of the sequence, adjustments or equivalent replacements in the following several aspects may be included but are not limited.

1. Locations of fewer elements in the sorted sequence are exchanged. For example, a sequence number location may be adjusted by a specified magnitude, for example, the specified magnitude is 5. A location of an element whose sequence number is 10 may be adjusted by left and right five locations.

2. Some elements in the sorted sequence are adjusted, but channel sets that are used to transmit T-bit information and that are selected based on the sorted sequence are consistent or similar.

3. The sorted sequence includes N elements from 1 to N, and the N elements from 1 to N represent sequence numbers of N polar channels. Actually, the sequence numbers of the N polar channels may alternatively start from 0 and end up with N−1, that is, subtracting 1 from the sequence numbers in the foregoing sorted sequence. This is also a sequence number form in the foregoing computation manner. Certainly, a sequence number or an identifier of the polar channel may alternatively be represented in another manner. The specific representation manner does not affect a specific location of the polar channel in the sorted sequence.

4. Sequence numbers of N polar channels in the sorted sequence are arranged in descending order of reliability of the N polar channels. Actually, sequence numbers of N polar channels may alternatively be arranged in ascending order of reliability of the N polar channels. That is, elements in the foregoing sorted sequence are arranged in reverse order or in inverse order.

5. The foregoing sorted sequence may alternatively be represented by using normalized reliability sequences or equivalent reliability sorted-sequences of various channels. For example, a sorting location of a channel x in the foregoing sequence is n (where a smallest sequence number in the sorted sequence is denoted as 1). In this case, reliability of the channel may be represented as n or normalized n/N, where N is a length of the sorted sequence.

Figure 3:
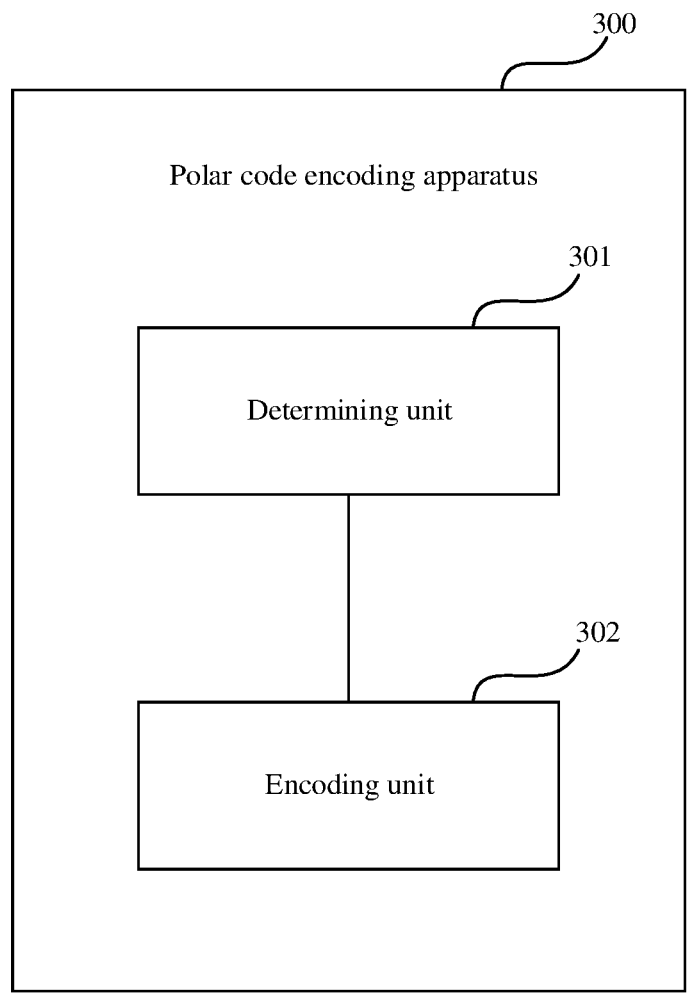
FIG. 3 is a first schematic structural diagram of a polar code encoding apparatus according to an embodiment of this application.

Based on the polar code encoding method shown in FIG. 2, as shown in FIG. 3, an embodiment of this application further provides a polar code encoding apparatus 300. The polar code encoding apparatus 300 is configured to perform the polar code encoding method shown in FIG. 2. The polar code encoding apparatus 300 includes a determining unit 301, configured to determine a sorted sequence used to encode to-be-encoded bits, where the sorted sequence is used to represent reliability sorting of N polar channels, N is a mother code length of a polar code, and N is a positive integer power of 2, and an encoding unit 302, configured to perform polar code encoding on the to-be-encoded bits by using the sorted sequence, to obtain encoded bits.

Optionally, a length of the to-be-encoded bits is K, the K to-be-encoded bits are mapped to K of the N polar channels, and reliability of the K polar channels is higher than reliability of remaining N-K polar channels.

Optionally, the determining unit 301 is further configured to obtain a first sequence, a second sequence, a third sequence, a fourth sequence, and a fifth sequence.

If arrangement is performed in the sorted sequence in ascending order of reliability of polar channels, the determining unit 301 is specifically configured to obtain a first subsequence that is in the second sequence and in which a sequence number is less than or equal to 64, update sorting that is of first (64−t1+1) sequence numbers in the first subsequence and that is in the first subsequence based on sorting that is of the first (64−t1+1) sequence numbers in the first subsequence and that is in the first sequence, and obtain a to-be-compared second sequence based on an updated first subsequence, select, based on a first target length k1 separately from the second sequence and the to-be-compared second sequence, sequence numbers corresponding to k1 most reliable locations, and obtain encoded-codeword performance results separately based on the selected sequence numbers and a generated second intermediate result sequence, where the second intermediate result sequence includes (k1-1) selected sequence numbers, the target length k1 sequentially ranges from t1 to kmax(M), and kmax(M) is a maximum information bit length when the mother code length is M, select, according to a performance determining rule, a sequence number for which optimum performance is obtained, and update the second intermediate result sequence based on the selected sequence number for which the optimum performance is obtained, and use an updated second intermediate result sequence obtained when k1 is set to kmax(M) as the updated first subsequence, and place the updated first subsequence in the second sequence, to obtain an updated second sequence, obtain a second subsequence that is in the third sequence and in which a sequence number is less than or equal to 128, update sorting that is of first (128−t2+1) sequence numbers in the second subsequence and that is in the second subsequence based on sorting that is of the first (128−t2+1) sequence numbers in the second subsequence and that is in the updated second sequence, and obtain a to-be-compared third sequence based on an updated second subsequence, select, based on a second target length k2 separately from the third sequence and the to-be-compared third sequence, sequence numbers corresponding to k2 most reliable locations, and obtain encoded-codeword performance results separately based on the selected sequence numbers and a generated third intermediate result sequence, where the third intermediate result sequence includes (k2-1) selected sequence numbers, the second target length k2 sequentially ranges from t2 to kmax(M), and kmax(M) is the maximum information bit length when the mother code length is M=128, select, according to the performance determining rule, a sequence number for which optimum performance is obtained, and update the third intermediate result sequence based on the selected sequence number for which the optimum performance is obtained, and use an updated third intermediate result sequence obtained when k2 is set to kmax(M) as the updated second subsequence, and place the updated second subsequence in the third sequence, to obtain an updated third sequence, obtain a third subsequence that is in the fourth sequence and in which a sequence number is less than or equal to 256, update sorting that is of first (256−t3+1) sequence numbers in the third subsequence and that is in the third subsequence based on sorting that is of the first (256−t3+1) sequence numbers in the third subsequence and that is in the updated third sequence, and obtain a to-be-compared fourth sequence based on an updated third subsequence, select, based on a third target length k3 separately from the fourth sequence and the to-be-compared fourth sequence, sequence numbers corresponding to k3 most reliable locations, and obtain encoded-codeword performance results separately based on the selected sequence numbers and a generated fourth intermediate result sequence, where the fourth intermediate result sequence includes (k3-1) selected sequence numbers, the third target length k3 sequentially ranges from t3 to kmax(M), and kmax(M) is the maximum information bit length when the mother code length is M=256, select, according to the performance determining rule, a sequence number for which optimum performance is obtained, and update the fourth intermediate result sequence based on the selected sequence number for which the optimum performance is obtained, and use an updated fourth intermediate result sequence obtained when k3 is set to kmax(M) as the updated third subsequence, and place the updated third subsequence in the fourth sequence, to obtain an updated fourth sequence, and obtain a fourth subsequence that is in the fifth sequence and in which a sequence number is less than or equal to 512, update sorting that is of first (512−t4+1) sequence numbers in the fourth subsequence and that is in the fourth subsequence based on sorting that is of the first (512−t4+1) sequence numbers in the fourth subsequence and that is in the updated fourth sequence, and obtain a to-be-compared fifth sequence based on an updated fourth subsequence, select, based on a fourth target length k4 separately from the fifth sequence and the to-be-compared fifth sequence, sequence numbers corresponding to k4 most reliable locations, and obtain encoded-codeword performance results separately based on the selected sequence numbers and a generated fifth intermediate result sequence, where the fifth intermediate result sequence includes (k4-1) selected sequence numbers, the fourth target length k4 sequentially ranges from k4 to kmax(M), and kmax(M) is the maximum information bit length when the mother code length is M=512, select, according to the performance determining rule, a sequence number for which optimum performance is obtained, and update the fifth intermediate result sequence based on the selected sequence number for which the optimum performance is obtained, and use an updated fifth intermediate result sequence obtained when k4 is set to kmax(M) as the updated fourth subsequence, and place the updated fourth subsequence in the fifth sequence, to obtain an updated fifth sequence, where t1, t2, t3, and t4 are determined according to the performance determining rule.

Optionally, when obtaining the first sequence, the second sequence, the third sequence, the fourth sequence, and the fifth sequence, the determining unit 301 is specifically configured to sequentially select one sequence number from $(M-k_5+1)$ sequence numbers based on a fifth target length $k_5$, and each time one sequence number is selected, obtain an encoded-codeword performance result based on the selected sequence number and a generated intermediate result sequence, where the intermediate result sequence includes $(k_5-1)$ selected sequence numbers, the $(M-k_5+1)$ sequence numbers are non-overlapping with the intermediate result sequence, the target length $k_5$ sequentially ranges from 1 to $k_{max}^{(M)}$, and $k_{max}^{(M)}$ is the maximum information bit length when the mother code length is M, and select, according to the performance determining rule, a sequence number for which optimum performance is obtained, and update the intermediate result sequence based on the selected sequence number for which the optimum performance is obtained.

M is an integer power of 2, when M=64, an updated intermediate result sequence obtained when $k_5$ is set to $k_{max}^{(M)}$ is used as the first sequence, when M=128, an updated intermediate result sequence obtained when $k_5$ is set to $k_{max}^{(M)}$ is used as the second sequence, when M=256, an updated intermediate result sequence obtained when $k_5$ is set to $k_{max}^{(M)}$ is used as the third sequence, when M=512, an updated intermediate result sequence obtained when $k_5$ is set to $k_{max}^{(M)}$ is used as the fourth sequence, and when M=1024, an updated intermediate result sequence obtained when $k_5$ is set to $k_{max}^{(M)}$ is used as the fifth sequence.

Figure 4:
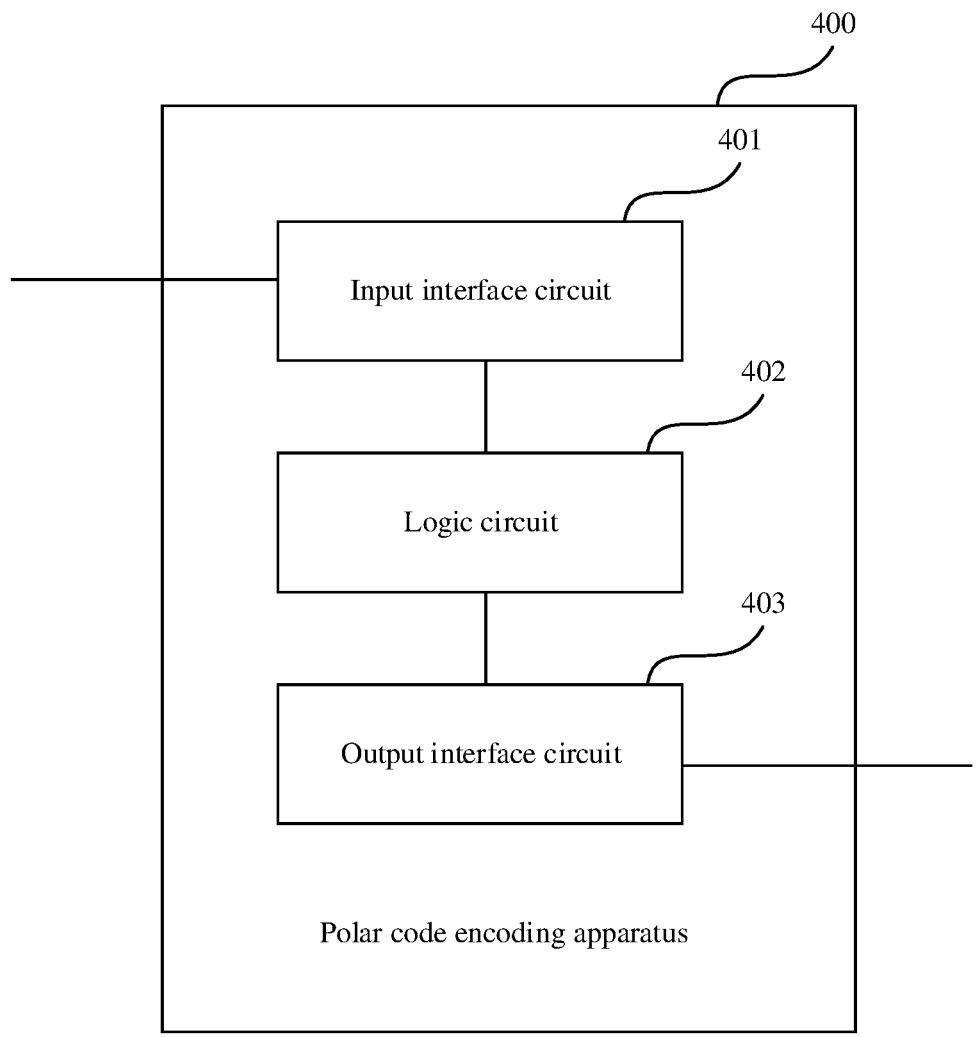
FIG. 4 is a second schematic structural diagram of a polar code encoding apparatus according to an embodiment of this application.

Based on a same inventive concept of the polar code encoding method shown in FIG. 2, as shown in FIG. 4, an embodiment of this application further provides a polar code encoding apparatus 400. The polar code encoding apparatus 400 is configured to perform the polar code encoding method shown in FIG. 2. A part or all of the polar code encoding method shown in FIG. 2 may be implemented by using hardware or software. When the hardware is used for implementation, the polar code encoding apparatus 400 includes an input interface circuit 401, configured to obtain to-be-encoded bits, a logical circuit 402, configured to perform the polar code encoding method shown in FIG. 2, where for details, refer to the descriptions in the foregoing method embodiment, and details are not described herein again, and an output interface circuit 403, configured to output an encoded bit sequence.

Optionally, during specific implementation, the polar code encoding apparatus 400 may be a chip or an integrated circuit.

Figure 5:
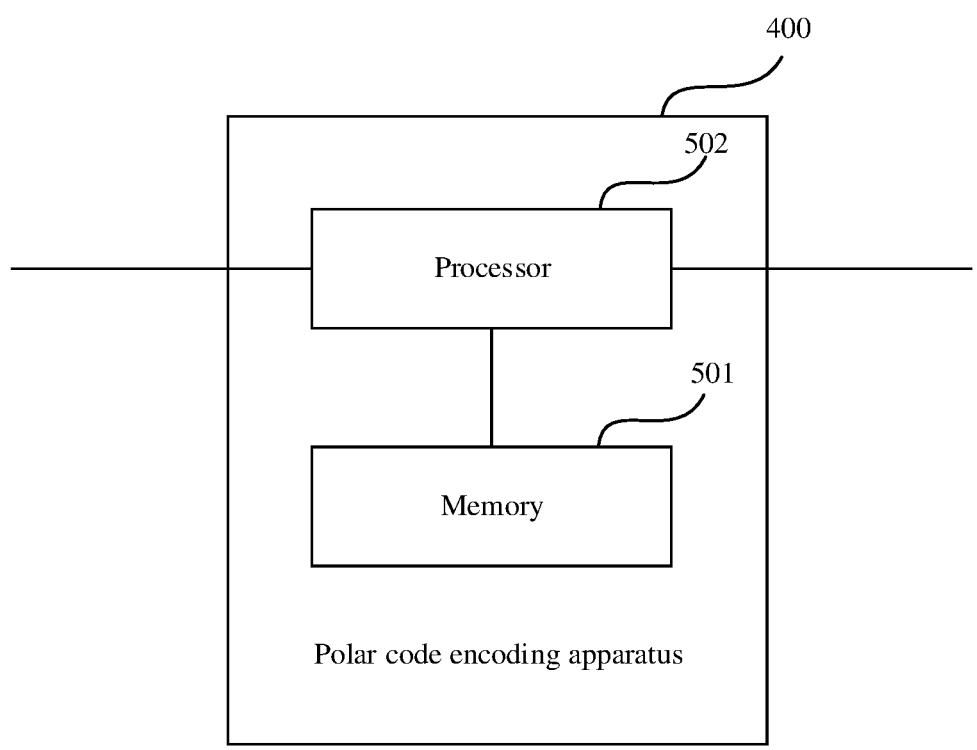
FIG. 5 is a third schematic structural diagram of a polar code encoding apparatus according to an embodiment of this application.

Optionally, when a part or all of the polar code encoding method in the foregoing embodiment is implemented by using software, as shown in FIG. 5, the polar code encoding apparatus 400 includes a memory 501, configured to store a program, and a processor 502, configured to execute the program stored in the memory 501, where when the program is executed, the polar code encoding apparatus 400 may implement the polar code encoding method provide in the embodiment in FIG. 2.

Figure 6:
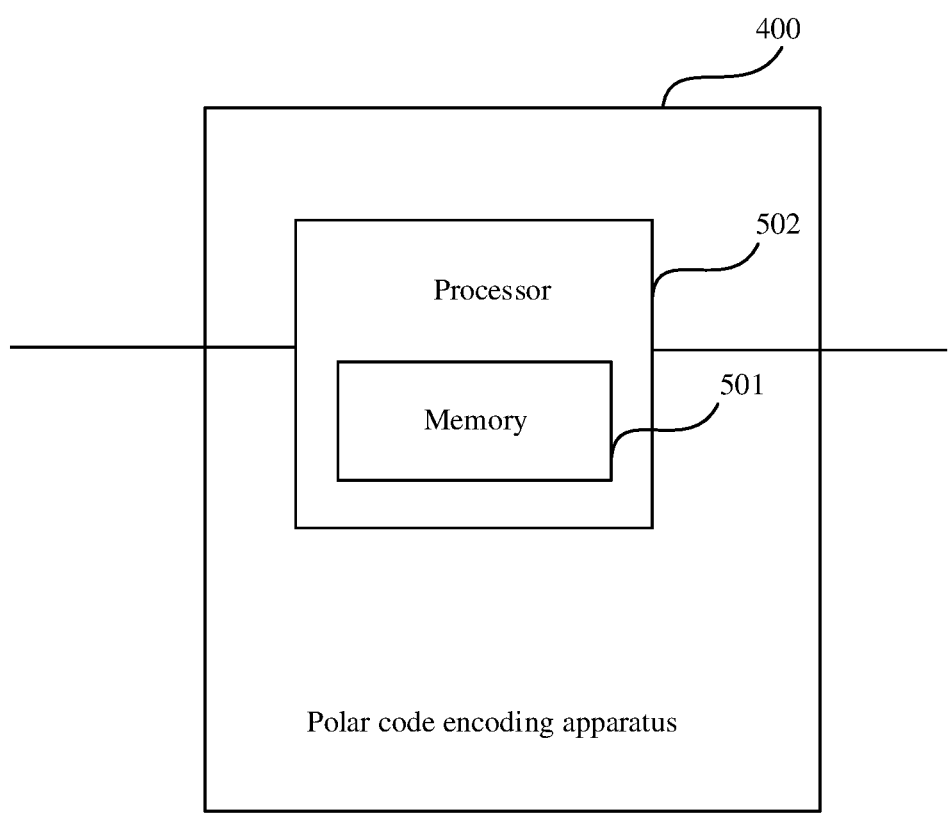
FIG. 6 is a fourth schematic structural diagram of a polar code encoding apparatus according to an embodiment of this application.

Optionally, the memory 501 may be a physically independent unit. Alternatively, as shown in FIG. 6, a memory 501 and a processor 502 may be integrated together.

Optionally, when a part or all of the encoding method in the embodiment in FIG. 2 is implemented by using software, the polar code transmitting apparatus 400 may alternatively include only a processor 502. A memory 501 configured to store a program is located outside of the polar code transmitting apparatus 400, and the processor 502 is connected to the memory 501 by using a circuit/a cable, and is configured to read and execute the program stored in the memory 501.

The processor 502 may be a central processing unit (CPU), a network processor (NP), or a combination of a CPU and an NP.

The processor 502 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 501 may include a volatile memory, for example, a random access memory (RAM). The memory 501 may also include a non-volatile memory, for example, a flash memory, a hard disk drive (HDD), or a solid-state drive (SSD). The memory 501 may further include a combination of the foregoing types of memories.

An embodiment of this application further provides a computer storage medium, storing a computer program, where the computer program is used to perform the polar code encoding method shown in FIG. 2.

An embodiment of this application further provides a computer program product including an instruction. When the computer program product is run on a computer, the computer is enabled to perform the polar code encoding method shown in FIG. 2.

A person skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (e.g., a system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

Obviously, persons skilled in the art can make various modifications and variations to the embodiments of this application without departing from the spirit and scope of the embodiments of this application. This application is intended to cover these modifications and variations provided that they fall within the scope of protection defined by the following claims and their equivalent technologies.

What is claimed is:

1. A method, comprising:
    determining, by an apparatus, a sorted sequence to encode to-be-encoded bits, wherein the sorted sequence represents reliability sorting of N polar channels, wherein N is a mother code length of a polar code, wherein N is a positive integer, wherein N is a power of two, and wherein a minimum sequence number of polar channels in the sorted sequence is 1;

obtaining encoded bits by the apparatus by performing polar code encoding on the to-be-encoded bits using the sorted sequence; and outputting, by the apparatus, the encoded bits;

wherein when N=1024, the sorted sequence is a first sorted sequence;

wherein a location of a polarized channel whose sequence number is 1 in the first sorted sequence is a $1^{st}$ location;

wherein a location of a polarized channel whose sequence number is 2 in the first sorted sequence is a $2^{nd}$ location;

wherein a location of a polarized channel whose sequence number is 17 in the first sorted sequence is a 6th location;

wherein a location of a polarized channel whose sequence number is 33 in the first sorted sequence is a $7^{th}$ location;

wherein a location of a polarized channel whose sequence number is 41 in the first sorted sequence is a $30^{th}$ location;

wherein a location of a polarized channel whose sequence number is 258 in the first sorted sequence is a $38^{th}$ location;

wherein a location of a polarized channel whose sequence number is 309 in the first sorted sequence is a $293^{rd}$ location;

wherein a location of a polarized channel whose sequence number is 217 in the first sorted sequence is a $294^{th}$ location;

wherein a location of a polarized channel whose sequence number is 127 in the first sorted sequence is a $461^{st}$ location;

wherein a location of a polarized channel whose sequence number is 243 in the first sorted sequence is a $462^{nd}$ location;

wherein a location of a polarized channel whose sequence number is 684 in the first sorted sequence is a $697^{th}$ location;

wherein a location of a polarized channel whose sequence number is 906 in the first sorted sequence is a $728^{th}$ location;

wherein a location of a polarized channel whose sequence number is 745 in the first sorted sequence is a $732^{nd}$ location;

wherein a location of a polarized channel whose sequence number is 869 in the first sorted sequence is a $768^{th}$ location;

wherein a location of a polarized channel whose sequence number is 727 in the first sorted sequence is a $784^{th}$ location;

wherein a location of a polarized channel whose sequence number is 872 in the first sorted sequence is a $903^{rd}$ location;

wherein a location of a polarized channel whose sequence number is 973 in the first sorted sequence is a $921^{st}$ location;

wherein a location of a polarized channel whose sequence number is 878 in the first sorted sequence is a $923^{rd}$ location;

wherein a location of a polarized channel whose sequence number is 891 in the first sorted sequence is a 954th location;

wherein a location of a polarized channel whose sequence number is 999 in the first sorted sequence is a $983^{rd}$ location;

wherein a location of a polarized channel whose sequence number is 989 in the first sorted sequence is a $986^{th}$ location;

wherein a location of a polarized channel whose sequence number is 1000 in the first sorted sequence is a $1002^{nd}$ location;

wherein a location of a polarized channel whose sequence number is 1019 in the first sorted sequence is a $1016^{th}$ location;

wherein a location of a polarized channel whose sequence number is 1021 in the first sorted sequence is a $1018^{th}$ location;

wherein a location of a polarized channel whose sequence number is 1020 in the first sorted sequence is a $1021^{st}$ location;

wherein a location of a polarized channel whose sequence number is 1022 in the first sorted sequence is a $1022^{nd}$ location;

wherein a location of a polarized channel whose sequence number is 1023 in the first sorted sequence is a $1023^{rd}$ location; and wherein a location of a polarized channel whose sequence number is 1024 in the first sorted sequence is a 1024th location.

2. The method according to claim 1, wherein the sorted sequence is in ascending order of reliability of the N polar channels.

3. The method according to claim 1, wherein, when N is less than 1024, the sorted sequence is a second sorted sequence, and the second sorted sequence is a subsequence of the first sorted sequence.

4. The method according to the claim 3, wherein N equals one of 64, 128, 256, or 512.

5. The method according to claim 1, wherein a length of the to-be-encoded bits is K, and wherein the to-be-encoded bits are mapped to K polar channels of the N polar channels according to reliabilities of the polar channels.

6. The method according to claim 5, wherein reliabilities of the K polar channels are higher than reliabilities of a remaining N-K polar channels of the N polar channels.

7. The method according to claim 1, wherein the sorted sequence includes values of reliability of the N polar channels, and wherein the each of values of the reliability is one of a value of normalized reliability or a value of equivalent reliability.

8. A communication apparatus, comprising:

at least one processor; and at least one non-transitory computer readable memory coupled to the at least one processor and storing computer program for execution by the at least one processor, the computer program having instructions to:

determine a sorted sequence to encode to-be-encoded bits, wherein the sorted sequence represents reliability sorting of N polar channels, wherein N is a mother code length of a polar code, wherein N is a positive integer, wherein N is a power of two, and wherein a minimum sequence number of polar channels in the sorted sequence is 1;

obtain encoded bits by performing polar code encoding on the to-be-encoded bits using the sorted sequence; and output, the encoded bits;

wherein, when N=1024, the sorted sequence is a first sorted sequence;

wherein a location of a polarized channel whose sequence number is 1 in the first sorted sequence is a $1^{st}$ location;

wherein a location of a polarized channel whose sequence number is 2 in the first sorted sequence is a $2^{nd}$ location;

wherein a location of a polarized channel whose sequence number is 17 in the first sorted sequence is a $6^{th}$ location;

wherein a location of a polarized channel whose sequence number is 33 in the first sorted sequence is a $7^{th}$ location;

wherein a location of a polarized channel whose sequence number is 41 in the first sorted sequence is a $30^{th}$ location;

wherein a location of a polarized channel whose sequence number is 258 in the first sorted sequence is a $38^{th}$ location;

wherein a location of a polarized channel whose sequence number is 309 in the first sorted sequence is a $293^{rd}$ location;

wherein a location of a polarized channel whose sequence number is 217 in the first sorted sequence is a $294^{th}$ location;

wherein a location of a polarized channel whose sequence number is 127 in the first sorted sequence is a $461^{st}$ location;

wherein a location of a polarized channel whose sequence number is 243 in the first sorted sequence is a $462^{nd}$ location;

wherein a location of a polarized channel whose sequence number is 684 in the first sorted sequence is a $697^{th}$ location;

wherein a location of a polarized channel whose sequence number is 906 in the first sorted sequence is a $728^{th}$ location;

wherein a location of a polarized channel whose sequence number is 745 in the first sorted sequence is a $732^{nd}$ location;

wherein a location of a polarized channel whose sequence number is 869 in the first sorted sequence is a $768^{th}$ location;

wherein a location of a polarized channel whose sequence number is 727 in the first sorted sequence is a $784^{th}$ location;

wherein a location of a polarized channel whose sequence number is 872 in the first sorted sequence is a $903^{rd}$ location;

wherein a location of a polarized channel whose sequence number is 973 in the first sorted sequence is a $921^{st}$ location;

wherein a location of a polarized channel whose sequence number is 878 in the first sorted sequence is a $923^{rd}$ location;

wherein a location of a polarized channel whose sequence number is 891 in the first sorted sequence is a $954^{th}$ location;

wherein a location of a polarized channel whose sequence number is 999 in the first sorted sequence is a $983^{rd}$ location;

wherein a location of a polarized channel whose sequence number is 989 in the first sorted sequence is a $986^{th}$ location;

wherein a location of a polarized channel whose sequence number is 1000 in the first sorted sequence is a $1002^{nd}$ location;

wherein a location of a polarized channel whose sequence number is 1019 in the first sorted sequence is a $1016^{th}$ location;

wherein a location of a polarized channel whose sequence number is 1021 in the first sorted sequence is a $1018^{th}$ location;

wherein a location of a polarized channel whose sequence number is 1020 in the first sorted sequence is a $1021^{st}$ location;

wherein a location of a polarized channel whose sequence number is 1022 in the first sorted sequence is a $1022^{nd}$ location;

wherein a location of a polarized channel whose sequence number is 1023 in the first sorted sequence is a $1023^{rd}$ location; and wherein a location of a polarized channel whose sequence number is 1024 in the first sorted sequence is a $1024^{th}$ location.

9. The apparatus according to claim 8, wherein the sorted sequence is in ascending order of reliability of the N polar channels.

10. The apparatus according to claim 8, wherein, when N is less than 1024, the sorted sequence is a second sorted sequence, and wherein the second sorted sequence is a subsequence of the first sorted sequence.

11. The apparatus according to the claim 10, wherein N equals one of 64, 128, N=256, or 512.

12. The apparatus according to claim 8, wherein a length of the to-be-encoded bits is K, and wherein the to-be-encoded bits are mapped to K polar channels of the N polar channels according to reliabilities of the polar channels.

13. The apparatus according to claim 12, wherein reliabilities of the K polar channels are higher than reliabilities of a remaining N-K polar channels of the N polar channels.

14. The apparatus according to claim 8, wherein the sorted sequence includes values of reliability of the N polar channels, and wherein the each of values of the reliability is one of a value of normalized reliability or a value of equivalent reliability.

15. A non-transitory computer readable storage medium, comprising a computer program executable by a communication apparatus, the computer program including instructions for:

determining a sorted sequence to encode to-be-encoded bits, wherein the sorted sequence represents reliability sorting of N polar channels, wherein N is a mother code length of a polar code, wherein N is a positive integer, wherein N is a power of two, and wherein a minimum sequence number of polar channels in the sorted sequence is 1;

obtain encoded bits by performing polar code encoding on the to-be-encoded bits using the sorted sequence; and outputting, the encoded bits;

wherein, when N=1024, the sorted sequence is a first sorted sequence;

wherein a location of a polarized channel whose sequence number is 1 in the first sorted sequence is a $1^{st}$ location;

wherein a location of a polarized channel whose sequence number is 2 in the first sorted sequence is a $2^{nd}$ location;

wherein a location of a polarized channel whose sequence number is 17 in the first sorted sequence is a $6^{th}$ location;

wherein a location of a polarized channel whose sequence number is 33 in the first sorted sequence is a $7^{th}$ location;

wherein a location of a polarized channel whose sequence number is 41 in the first sorted sequence is a $30^{th}$ location;

wherein a location of a polarized channel whose sequence number is 258 in the first sorted sequence is a $38^{th}$ location;

wherein a location of a polarized channel whose sequence number is 309 in the first sorted sequence is a $293^{rd}$ location;
wherein a location of a polarized channel whose sequence number is 217 in the first sorted sequence is a $294^{th}$ location;
wherein a location of a polarized channel whose sequence number is 127 in the first sorted sequence is a $461^{st}$ location;
wherein a location of a polarized channel whose sequence number is 243 in the first sorted sequence is a $462^{nd}$ location;
wherein a location of a polarized channel whose sequence number is 684 in the first sorted sequence is a $697^{th}$ location;
wherein a location of a polarized channel whose sequence number is 906 in the first sorted sequence is a $728^{th}$ location;
wherein a location of a polarized channel whose sequence number is 745 in the first sorted sequence is a $732^{nd}$ location;
wherein a location of a polarized channel whose sequence number is 869 in the first sorted sequence is a $768^{th}$ location;
wherein a location of a polarized channel whose sequence number is 727 in the first sorted sequence is a $784^{th}$ location;
wherein a location of a polarized channel whose sequence number is 872 in the first sorted sequence is a $903^{rd}$ location;
wherein a location of a polarized channel whose sequence number is 973 in the first sorted sequence is a $921^{st}$ location;
wherein a location of a polarized channel whose sequence number is 878 in the first sorted sequence is a $923^{rd}$ location;
wherein a location of a polarized channel whose sequence number is 891 in the first sorted sequence is a $954^{th}$ location;
wherein a location of a polarized channel whose sequence number is 999 in the first sorted sequence is a $983^{rd}$ location;
wherein a location of a polarized channel whose sequence number is 989 in the first sorted sequence is a $986^{th}$ location;
wherein a location of a polarized channel whose sequence number is 1000 in the first sorted sequence is a $1002^{nd}$ location;
wherein a location of a polarized channel whose sequence number is 1019 in the first sorted sequence is a $1016^{th}$ location;
wherein a location of a polarized channel whose sequence number is 1021 in the first sorted sequence is a $1018^{th}$ location;
wherein a location of a polarized channel whose sequence number is 1020 in the first sorted sequence is a $1021^{st}$ location;
wherein a location of a polarized channel whose sequence number is 1022 in the first sorted sequence is a $1022^{nd}$ location;
wherein a location of a polarized channel whose sequence number is 1023 in the first sorted sequence is a $1023^{rd}$ location; and
wherein a location of a polarized channel whose sequence number is 1024 in the first sorted sequence is a $1024^{th}$ location.

16. The non-transitory computer readable storage medium according to claim 15, wherein the sorted sequence is in ascending order of reliability of the N polar channels.

17. The non-transitory computer readable storage medium according to claim 15, wherein, when N is less than 1024, the sorted sequence is a second sorted sequence, and wherein the second sorted sequence is a subsequence of the first sorted sequence.

18. The non-transitory computer readable storage medium to the claim 17, wherein N equals one of 64, 128, 256, or 512.

19. The non-transitory computer readable storage medium according to claim 15, wherein a length of the to-be-encoded bits is K, and wherein the to-be-encoded bits are mapped to K polar channels of the N polar channels based on reliabilities of the polar channels.

20. The non-transitory computer readable storage medium according to claim 19, wherein reliabilities of the K polar channels are higher than reliabilities of a remaining N-K polar channels of the N polar channels.

* * * * *

UNITED STATES PATENT AND TRADEMARK OFFICE
CERTIFICATE OF CORRECTION

PATENT NO. : 11,316,538 B2
APPLICATION NO. : 17/188588
DATED : April 26, 2022
INVENTOR(S) : Wang et al.

It is certified that error appears in the above-identified patent and that said Letters Patent is hereby corrected as shown below:

In the Claims

Claim 1, Column 41, Line 12; delete "6th" and insert --$6^{th}$--.

Claim 1, Column 41, Line 60; delete "954th" and insert --$954^{th}$--.

Claim 1, Column 42, Line 21; delete "1024th" and insert --$1024^{th}$--.

Signed and Sealed this
Seventh Day of June, 2022

Katherine Kelly Vidal
*Director of the United States Patent and Trademark Office*